(12) United States Patent
Nimura et al.

(10) Patent No.: US 10,859,882 B2
(45) Date of Patent: Dec. 8, 2020

(54) ELECTRO-OPTICAL DEVICE AND ELECTRONIC APPARATUS

(71) Applicant: SEIKO EPSON CORPORATION, Tokyo (JP)

(72) Inventors: Toru Nimura, Matsumoto (JP); Hiroyuki Oikawa, Chitose (JP); Shinsuke Fujikawa, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/392,753

(22) Filed: Apr. 24, 2019

(65) Prior Publication Data

US 2019/0331972 A1    Oct. 31, 2019

(30) Foreign Application Priority Data

Apr. 25, 2018 (JP) ................ 2018-083715

(51) Int. Cl.
*H01L 27/12* (2006.01)
*G02F 1/1362* (2006.01)
(Continued)

(52) U.S. Cl.
CPC ...... *G02F 1/136209* (2013.01); *G02F 1/1368* (2013.01); *G02F 1/136286* (2013.01); *H01L 27/124* (2013.01); *H01L 29/78633* (2013.01); *G02F 2001/13685* (2013.01); *G02F 2201/121* (2013.01); *G02F 2201/123* (2013.01); *G02F 2202/104* (2013.01); *H01L 21/0262* (2013.01); *H01L 21/02532* (2013.01); *H01L 21/02592* (2013.01); *H01L 21/02667* (2013.01); *H01L 27/1274* (2013.01); *H01L 29/66757* (2013.01); *H01L 29/78621* (2013.01); *H01L 29/78675* (2013.01)

(58) Field of Classification Search
CPC ............... H01L 27/124; H01L 27/1274; H01L 29/78633

See application file for complete search history.

(56) References Cited

U.S. PATENT DOCUMENTS 5,414,547 A * 5/1995 Matsuo ............. G02F 1/136209
349/44
5,859,677 A * 1/1999 Watanabe ......... G02F 1/133512
349/38
(Continued)

FOREIGN PATENT DOCUMENTS

JP    2003-177389 A    6/2003
JP    2004-054033 A    2/2004
(Continued)

*Primary Examiner* — Douglas M Menz
(74) *Attorney, Agent, or Firm* — Oliff PLC

(57) ABSTRACT

A liquid crystal apparatus as an electro-optical device includes a TFT including a semiconductor layer and a gate electrode, a scan line electrically connected to the gate electrode and provided in a layer different from a layer where the gate electrode is provided, a capacitance line, and a conductive light shielding film electrically connected to the capacitance line. The light shielding film is provided in a layer between the gate electrode and the scan line, and in a plan view, overlaps with at least a part of a low-concentration drain region of the semiconductor layer.

9 Claims, 16 Drawing Sheets

(51) Int. Cl.
  *H01L 29/786* (2006.01)
  *G02F 1/1368* (2006.01)
  *H01L 29/66* (2006.01)
  *H01L 21/02* (2006.01)

(56) References Cited

U.S. PATENT DOCUMENTS

2004/0051822 A1   3/2004  Sato
2008/0186423 A1   8/2008  Ishii

FOREIGN PATENT DOCUMENTS

JP       2008-191200 A    8/2008
JP       2010-039413 A    2/2010

* cited by examiner

ELECTRO-OPTICAL DEVICE AND ELECTRONIC APPARATUS

The present application is based on, and claims priority from JP Application Serial Number 2018-083715, filed Apr. 25, 2018, the disclosure of which is hereby incorporated by reference herein in its entirety.

BACKGROUND

1. Technical Field

The present disclosure relates to an electro-optical device and an electronic apparatus.

2. Related Art

In the related art, there is known an active drive type liquid crystal apparatus provided with a transistor having Light-Doped Drain (LDD) structure in a switching element of a pixel electrode, for one of electro-optical devices. Furthermore, when a liquid crystal apparatus is used for a liquid crystal light valve such as a projector, incident light to the liquid crystal apparatus is increased as compared with a direct view liquid crystal apparatus. With the increased incident light, an influence of stray light such as diffraction and reflection of the incident light for the transistor cannot be ignored. Specifically, it is difficult to hold a potential of pixels due to a light leakage of the transistor, so that a display quality may be deteriorated, resulting in an occurrence of flicker and an occurrence of display unevenness for each pixel. Therefore, a light valve for a projector needs a light shielding structure for more strongly shielding stray light.

For example, JP-A-2008-191200 discloses a substrate for an electro-optical device where light is shielded at both sides of an LDD region in a semiconductor layer of a transistor by an extension of a gate electrode to shield light above the LDD region by using a storage capacity in an upper layer and a wiring layer.

Further, the light shielding property is improved as the light shielding structure is provided close to the semiconductor layer of the transistor. For example, a liquid crystal display device provided with an upper light shielding layer immediately above a gate wiring layer is disclosed in JP-A-2003-177389. In addition, a structure in which a light shielding structure also serves as a gate wiring is proposed in JP-A-2003-177389.

However, in the light shielding structures of JP-A-2008-191200 and JP-A-2003-177389, there is a problem that an off-leak current in the transistor is liable to increase. More particularly, when the light shielding structure and the upper wiring layer and the like are provided close to the semiconductor layer of the transistor, a resistance of the LDD region in the semiconductor layer is lowered by an influence of a potential in the light shielding structure or the wiring layer, and thus, an off-leak current is easily increased. One of the original purposes of providing the LDD region in the semiconductor layer is to reduce the off-leak current, however, there is a possibility of an increase in the off-leak current due to attenuation of the reduction effect. An increase in the off-leak current causes pixel unevenness and the like in the liquid crystal apparatus.

In JP-A-2008-191200, although the light shielding property is improved as the extension (light shielding structure) of the gate electrode is close to the both sides of the LDD region, an off-leak current is easily increased by the gate potential. Therefore, the light shielding structure needs to be provided separately from the LDD region, so that an adverse effect is likely to occur such as a decrease in the aperture area of a pixel or a decrease in light shielding property. In JP-A-2003-177389, in addition to a tendency that the transistor easily receives an influence of the potential of the gate wiring layer, an off-leak current is more easily increased when the gate potential is applied to the light shielding structure. That is, there is a need for a light shielding structure capable of reliably reducing an off-leak current in the transistor.

SUMMARY

An electro-optical device of the present application is an electro-optical device including a plurality of layers layered on a substrate, and includes a transistor including a semiconductor layer and a gate electrode, a gate wiring electrically coupled to the gate electrode and provided in a layer different from a layer where the gate electrode is provided, a constant potential wiring, and a conductive light shielding film electrically coupled to the constant potential wiring. The light shielding film is provided in a layer between the gate electrode and the gate wiring, and overlaps with at least a part of a low-concentration drain region of the semiconductor layer, in a plan view from a layering direction of the plurality of layers.

It is preferable that in the electro-optical device, the light shielding film overlaps with at least a part of a boundary between the low-concentration drain region and the gate electrode in the plan view.

It is preferable that in the electro-optical device, in the plan view, the light shielding film includes an opening portion at a position overlapping with the gate electrode, the opening portion overlaps with a channel region of the semiconductor layer, and the opening portion is provided with a contact hole electrically coupling the gate electrode and the gate wiring.

It is preferable that in the electro-optical device, the opening portion is surrounded by the light shielding film in the plan view.

It is preferable that in the electro-optical device, the light shielding film overlaps with the channel region of the semiconductor layer in the plan view, the gate wiring includes a first gate wiring and a second gate wiring provided in a layer above the first gate wiring, the first gate wiring and the second gate wiring are electrically coupled to the gate electrode through the gate contact provided in a projection of the first gate wiring, the projection does not overlap with the light shielding film in the plan view, and the transistor and the light shielding film are provided in a layer between the first gate wiring and the second gate wiring.

It is preferable that in the electro-optical device, the constant potential wiring is provided in a layer below and a layer above a layer where the transistor is provided, and the light shielding film and the constant potential wiring are electrically coupled through a contact hole.

It is preferable that in the electro-optical device, in the plan view, the contact hole is provided on both sides interposing the low-concentration drain region.

It is preferable that in the electro-optical device, a pixel electrode and a common electrode corresponding to the pixel electrode are provided, and a potential different from a potential applied to the common electrode is applied to the constant potential wiring.

It is preferable that in the electro-optical device, a potential, different from a potential of any of the gate electrode and the source region and the drain region of the semiconductor layer, is applied to the light shielding film.

An electronic apparatus of the present application is an electronic apparatus including the electro-optical device.

DESCRIPTION OF EXEMPLARY EMBODIMENTS

Embodiments of the present disclosure will be described below with reference to the drawings. Embodiments described below are intended to explain one example of the present disclosure. The present disclosure is not limited to the following embodiments, and various types of modifications implemented as far as not to change the gist of the present disclosure are also included in the present disclosure.

Note that, in each of the drawings below, to make each layer and each member a recognizable size, each of the layers and each of the members are illustrated to be different from an actual scale and an actual angle. In the following description, for example, when "on a (the) substrate" is mentioned for the substrate, it will mean either one of a direct disposition on the substrate, disposition via another structure on the substrate, or disposition where a part of a component is disposed directly on the substrate and another part thereof is disposed via another structure on the substrate.

Embodiment 1

In the present embodiment, an active drive type liquid crystal apparatus including a thin film transistor (hereinafter, abbreviated as TFT), as a transistor, for each pixel will be described as an example of an electro-optical device. The liquid crystal apparatus can be used favorably as a liquid crystal light valve (optical modulation element) of, for example, a projection-type display apparatus (liquid crystal projector) as an electronic apparatus described below.

Configuration of Liquid Crystal Apparatus

Figure 1:
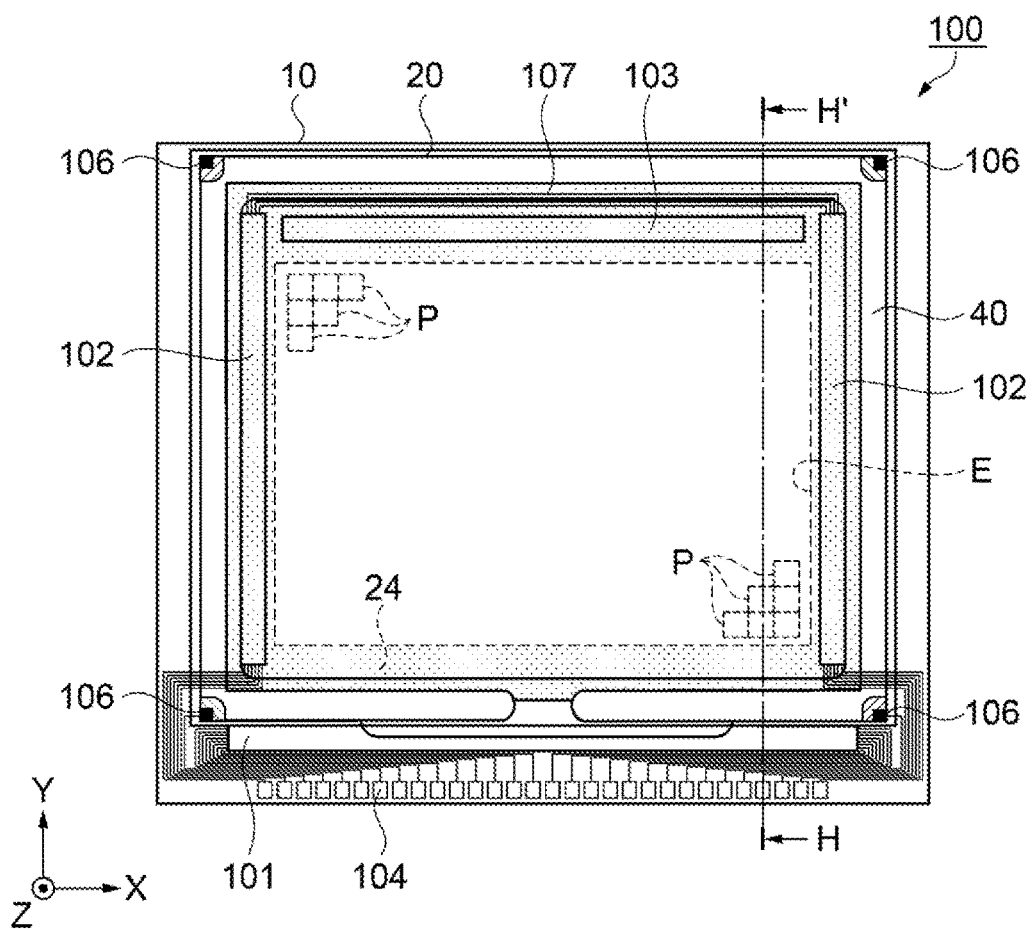
FIG. 1 is a plan view schematically illustrating a configuration of a liquid crystal apparatus as an electro-optical device according to Embodiment 1.
Figure 2:
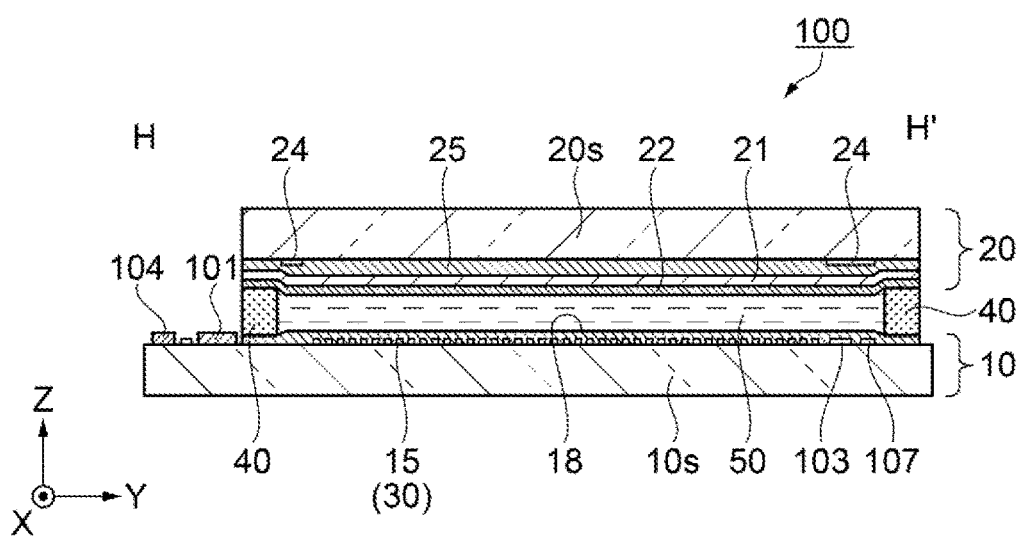
FIG. 2 is a cross-sectional view schematically illustrating a structure of the liquid crystal apparatus taken along line H-H' of FIG. 1.
Figure 3:
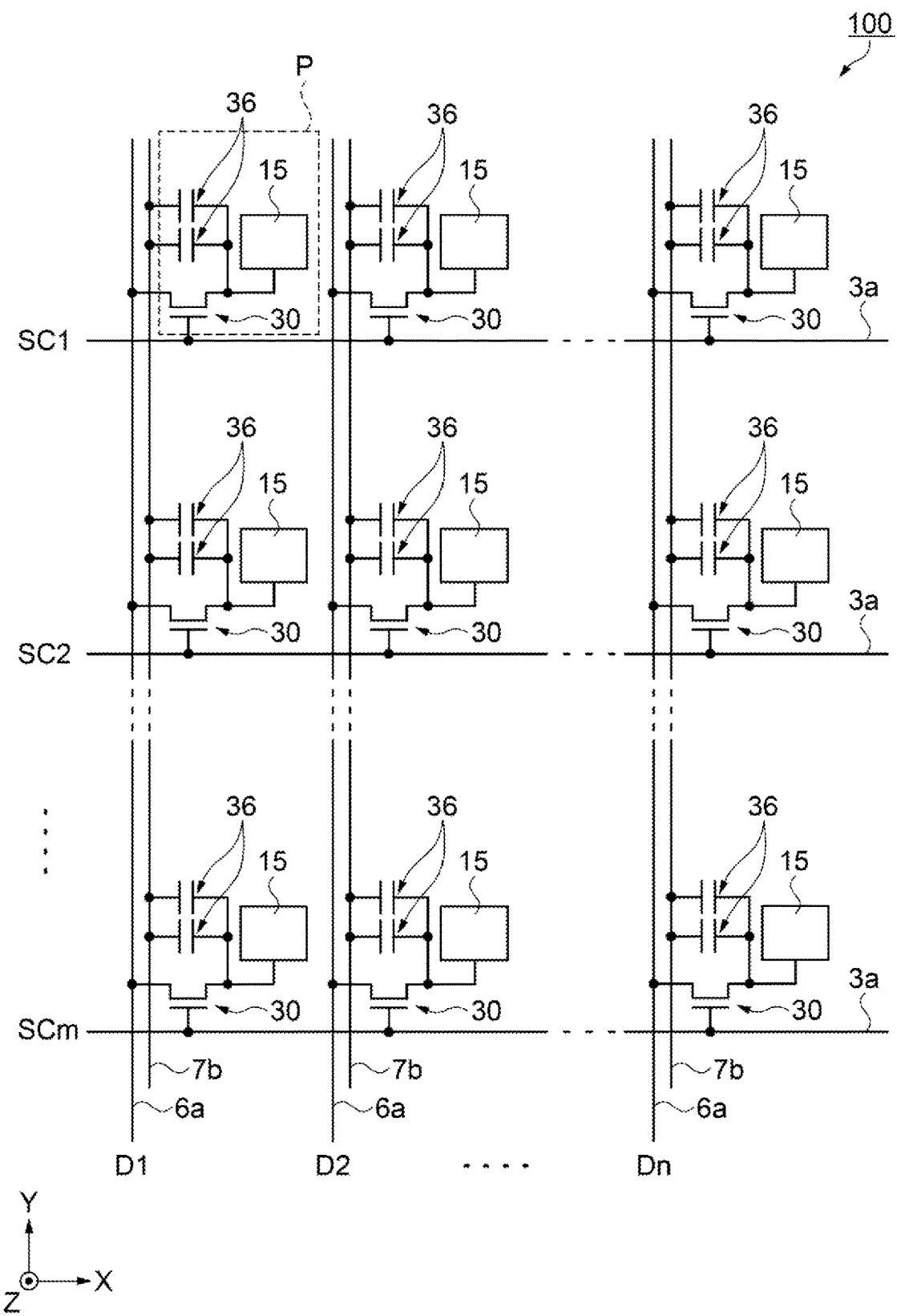
FIG. 3 is an equivalent circuit diagram illustrating an electrical configuration of the liquid crystal apparatus.

A configuration of the liquid crystal apparatus according to the present embodiment will be described with reference to FIG. 1 to FIG. 3. FIG. 1 is a plan view schematically illustrating a configuration of the liquid crystal apparatus as the electro-optical device according to Embodiment 1. FIG. 2 is a cross-sectional view schematically illustrating a structure of the liquid crystal apparatus taken along line H-H' of FIG. 1. FIG. 3 is an equivalent circuit diagram illustrating an electrical configuration of the liquid crystal apparatus.

As illustrated in FIG. 1 and FIG. 2, a liquid crystal apparatus 100 as an electro-optical device of the present embodiment includes an element substrate 10, a counter substrate 20 disposed opposite to the element substrate 10, and a liquid crystal layer 50 including a liquid crystal held between the element substrate 10 and the counter substrate 20.

For example, a substrate such as a glass substrate and a quartz substrate is used for a substrate 10s of the element substrate 10. For example, a transparent substrate such as a glass substrate and a quartz substrate is used for a substrate 20s of the counter substrate 20. The element substrate 10 and the counter substrate 20 may be referred to as "a pair of substrates", for example, below. Note that the substrate 10s (element substrate 10) is one example of a substrate of the present disclosure.

The element substrate 10 is larger than the counter substrate 20. The element substrate 10 and the counter substrate 20 are bonded to each other via a seal material 40 disposed along an outer edge of the counter substrate 20. A liquid crystal having positive or negative dielectric anisotropy is sealed in a gap between the pair of substrates to provide the liquid crystal layer 50.

As the seal material 40, for example, an adhesive such as a thermosetting or ultraviolet curable epoxy resin is employed. The seal material 40 is mixed with a spacer (not illustrated) configured to keep the gap between the pair of substrates constant.

A display region E in which a plurality of pixels P are arrayed in a matrix shape is provided on an inner side of the seal material 40. A partition portion 24 surrounding the display region E is provided between the seal material 40 and the display region E. For example, a light-shielding metal or an alloy or an oxide of the metal is employed as a forming material of the partition portion 24.

A dummy pixel region (not illustrated) which does not contribute to display is provided around the display region E. Note that, in the display region E, a light shielding portion (Black Matrix: BM) configured to divide a plurality of pixels P into d into sections may be provided on the counter substrate 20.

The element substrate 10 is provided with a terminal portion in which a plurality of external coupling terminals 104 are arrayed. A data line drive circuit 101 is provided between a first side portion along the terminal portion and the seal material 40. In addition, an inspection circuit 103 is provided between the seal material 40 along a second side portion facing the first side portion and the display region E.

Scan line drive circuits 102 are provided between the seal material 40 along a third side portion and a fourth side portion orthogonal to the first side portion and facing each other and the display region E. Further, between the seal material 40 of the second side portion and the inspection circuit 103, a plurality of lines of wiring 107 configured to couple the two scan line drive circuits 102 are provided.

The wiring coupled to the data line drive circuit 101 and the scan line drive circuit 102 is coupled to the plurality of external coupling terminals 104 disposed along the first side portion. Note that the disposition of the inspection circuit 103 is not limited to this example, and the inspection circuit 103 may be provided between the sealing material 40 along the data line driving circuit 101 and the display region E. Here, as used herein, a direction along the first side portion is set as an X-direction, and a direction orthogonal to the first side portion and along the third side portion and the fourth side portion facing each other is set to a Y-direction. In addition, a normal direction of the element substrate 10 and the counter substrate 20, orthogonal to the X-direction and the Y-direction is set to a Z-direction, and viewing from the Z-direction (positive Z-direction) is referred to as "in a plan view" or "planarly". Further, in the normal direction, a direction away from the counter substrate 20 is referred to as "above" (positive Z-direction), and a direction opposite to above is referred to as "below" (negative Z-direction).

As illustrated in FIG. 2, a surface on the side of the liquid crystal layer 50 of the substrate 10s is provided with a transmissive pixel electrode 15 and a TFT 30 or switching element arranged for each pixel P, a signal wiring, and an alignment film 18 configured to cover these components. The TFT 30 and the pixel electrode 15 are constituent elements of each pixel P.

The element substrate 10 employs a light shielding structure for preventing the TFT 30 from experiencing an unstable switching operation as a result of light being incident on a semiconductor layer of the TFT 30. The element substrate 10 includes the substrate 10s, the pixel electrode 15, the TFT 30, the signal wiring, and the alignment film 18 provided on the substrate 10s.

A surface on the side of the liquid crystal layer 50 of the substrate 20s is provided with the partition portion 24, an insulating layer 25 formed by covering the partition portion 24, a counter electrode 21 as a common electrode provided by covering the insulating layer 25, and an alignment film 22 configured to cover the counter electrode 21. The counter substrate 20 in the present embodiment includes at least the partition portion 24, the counter electrode 21, and the alignment film 22. In the present embodiment, an example where the common electrode is disposed, as the counter electrode 21, on the counter substrate 20 side is illustrated; however, this is not limiting. For example, the common electrode may be provided on the side of the element substrate 10 as in an In-Plane Switching (IPS) scheme or a Fringe Field Switching (FFS) scheme.

As illustrated in FIG. 1, the partition portion 24 surrounds the display region E and is provided at a position where the partition portion 24 planarly overlaps with the scan line drive circuit 102 and the inspection circuit 103. Thus, the partition portion 24 shields the light incident on these circuits from the counter substrate 20 side, and functions as a role of preventing malfunction of the circuits due to the light. In addition, the partition portion 24 shields the light to prevent unnecessary stray light from being incident on the display region E, and ensures high contrast in display of the display region E.

The insulating layer 25 is made of, for example, an inorganic material such as silicon oxide having light permeability. The insulating layer 25 covers the partition portion 24 and is formed so that the surface of the liquid crystal layer 50 side is flat. An example of a method for forming the insulating layer 25 includes a method for forming a film by using a plasma Chemical Vapor Deposition (CVD) method.

The counter electrode 21 includes a transparent conductive film such as an Indium Tin Oxide (ITO) film and an Indium Zinc Oxide (IZO) film, covers the insulating layer 25, and is electrically coupled to vertical conducting portions 106 provided at four corners of the counter substrate 20, as illustrated in FIG. 1. The vertical conduction portions 106 are electrically coupled to the wiring on the element substrate 10 side.

The alignment film 18 covering the pixel electrode 15 and the alignment film 22 covering the counter electrode 21 are selected based on an optical design of the liquid crystal apparatus 100. The alignment films 18 and 22 include an inorganic alignment film obtained by forming, as a film, an inorganic material such as silicon oxide (SiOx) by a vapor phase growth method, which is followed by being approximately vertically oriented to liquid crystal molecules having negative dielectric anisotropy. Further, as the alignment films 18 and 22, an organic alignment film of polyimide and the like may be employed in addition to the inorganic alignment film.

The liquid crystal apparatus 100 is, for example, a transmission type, and employs an optical design of a normally white mode where transmittance of the pixel P when no voltage is applied is larger than the transmittance when a voltage is applied, a normally black mode where the transmittance of the pixel P when no voltage is applied is smaller than the transmittance when the voltage is applied, or the like. In the liquid crystal panel including the element substrate 10 and the counter substrate 20, a polarizing element is disposed on each of a light incidence side and a light exit side in accordance with the optical design.

In the present embodiment, the inorganic alignment film and the liquid crystal having the negative dielectric anisotropy are used as the alignment films 18 and 22, and an example in which the normally black mode optical design is applied will be described below.

As illustrated in FIG. 3, the liquid crystal apparatus 100 includes a plurality of data lines 6, a plurality of capacitance lines 7 as constant potential wirings disposed in parallel along the data lines 6a, and a plurality of scan lines 3 as gate wirings, as signal wirings insulated from one another and orthogonal to one another at least in the display region E. A direction in which the scan lines 3a extend is the X-direction, and a direction in which the data lines 6a extend is the Y-direction. In FIG. 3, the capacitance lines 7b are illustrated to extend along the Y-direction, but the present disclosure is not limited thereto.

In each of regions partitioned by the scan lines 3, the data lines 6, the capacitance lines 7b, and like signal lines, the pixel electrode 15, the TFT 30 as a transistor, and a storage capacitance 36 are provided, and these components constitute a pixel circuit of the pixel P. In the present embodiment, two storage capacitances are used in parallel as the storage capacitance 36.

The scan lines 3a are electrically coupled to a gate of the TFT 30, and the data lines 6a are electrically coupled to a source/drain region of a data line side (one source/drain region) of the TFT 30. The scan lines 3a have a function of simultaneously controlling on/off of the TFTs 30 provided in the same row. The pixel electrode 15 is electrically coupled to a source/drain region of a pixel electrode side (the other source/drain region) of the TFT 30.

The data lines 6a are electrically coupled to the data line driving circuit 101 (see FIG. 1) and supply image signals D1, D2, . . . , Dn supplied from the data line driving circuit 101 to the pixel P. The scan lines 3a are coupled to the scan line drive circuits 102 (see FIG. 1) and supply scan signals SC1, SC2, . . . , SCm supplied from the scan line drive circuits 102 to each pixel P.

The image signal D1 to the image signal Dn supplied from the data line drive circuit 101 to the data lines 6a may be line-sequentially supplied in this order or may be supplied to the plurality of data lines 6a adjacent to one another in groups. The scan line drive circuit 102 line-sequentially supplies the scan signal SC1 to the scan signal SCm to the scan lines 3a in a pulsed manner at predetermined timing.

The liquid crystal apparatus 100 is configured such that the TFT 30 as a switching element is turned on only for a certain period by an input of the scan signal SC1 to the scan signal SCm, and thus, the image signal D1 to the image signal Dn supplied from the data lines 6a are written in the pixel electrodes 15 at predetermined timing. Then, the image signal D1 to the image signal Dn at predetermined level written in the liquid crystal layer 50 via the pixel electrodes 15 are held for a certain period between the pixel electrodes 15 and the counter electrode 21s disposed opposite via the liquid crystal layer 50.

To prevent the image signal D1 to the image signal Dn held from leaking, the storage capacitance 36 is coupled in parallel with liquid crystal capacitance formed between the pixel electrode 15 and the counter electrode 21. The storage capacitance 36 is provided between the source/drain region on the pixel electrode side of the TFT 30 and the capacitance line 7b.

Although not illustrated in FIG. 3, the inspection circuit 103 (see FIG. 1) is coupled to the data line 6a. Therefore, in a manufacturing process of the liquid crystal apparatus 100, when the image signal is detected, an operation defect and the like of the liquid crystal apparatus 100 can be checked.

In addition, the inspection circuit 103 may include a sampling circuit configured to sample the image signals described above and to supply the image signals to the data lines 6a, and a precharge circuit configured to supply precharge signals at predetermined voltage level to the data lines 6 in advance of the supply of the image signals.

Figure 4:
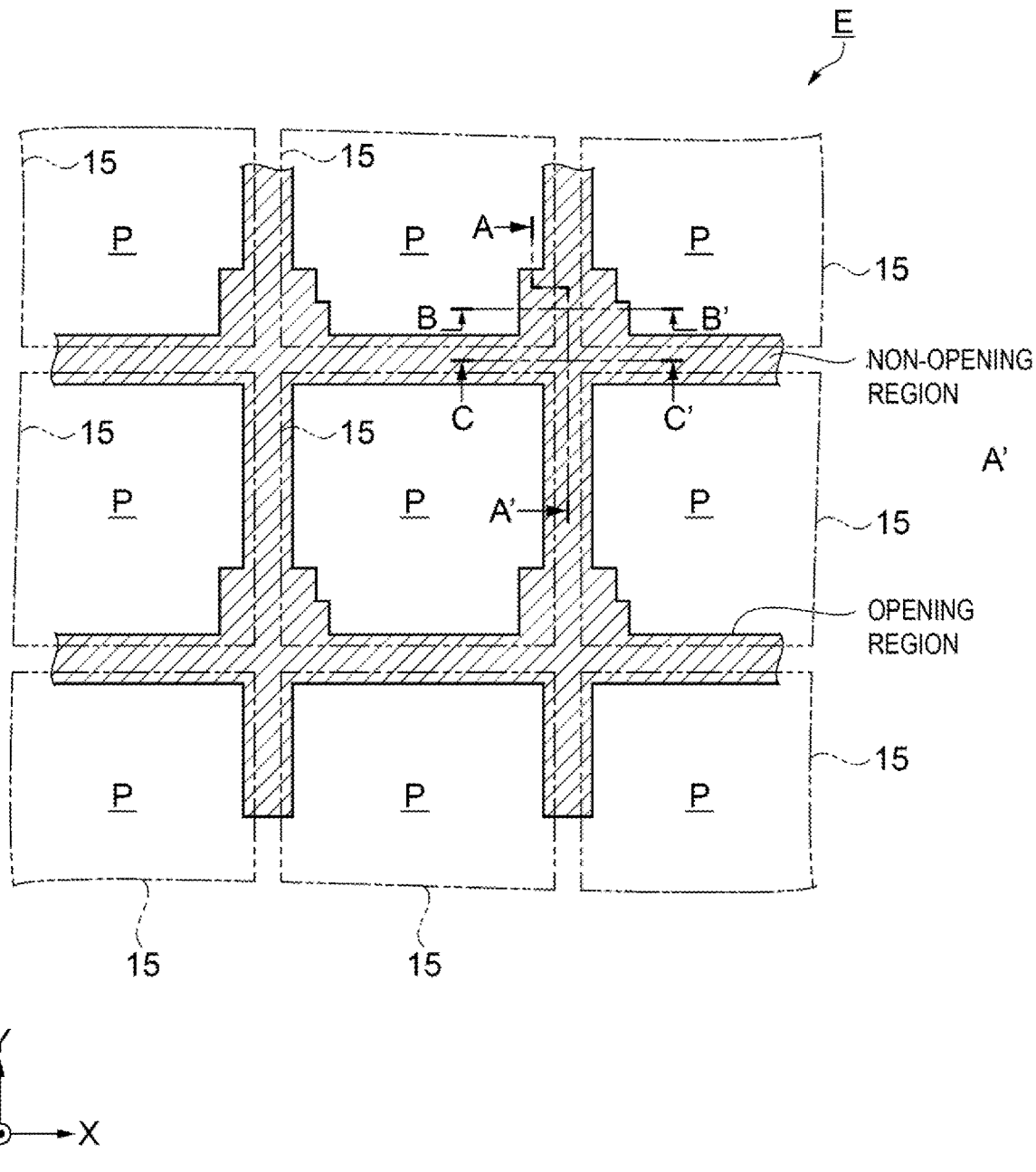
FIG. 4 is a plan view schematically illustrating disposition of pixels.

Next, a configuration of the pixel P in the liquid crystal apparatus 100 will be described with reference to FIG. 4. FIG. 4 is a plan view schematically illustrating disposition of pixels.

As illustrated in FIG. 4, the pixels P in the liquid crystal apparatus 100 are disposed in the X-direction the Y-direction in a matrix shape. The pixels P has an opening region having, for example, a substantially quadrangle shape (substantially square shape) in a plan view. The opening region is surrounded by non-opening regions each having a light shielding property and extending in the X-direction and in the Y-direction to be provided in a lattice shape.

In the non-opening regions extending in the X-direction, the scan lines 3a (see FIG. 3) are provided. A conductive member having a light shielding property is used for each scan line 3a, and the non-opening regions partially include the scan lines 3a.

In the non-opening regions extending in the Y-direction, the data lines 6s (see FIG. 3) are provided. A conductive member having a light shielding property is also used for each data line 6a, and the non-opening regions partially include the data lines 6a.

The non-opening region is configured to include a light shielding film, a capacitance line 7b, and the like described later, in addition to the scan line 3a and the data lines 6a provided on the element substrate 10. Further, the non-opening region may be configured to include, in the counter substrate 20, a light shielding portion (BM) patterned like a lattice and provided in the same layer as the partition portion 24 (see FIG. 2).

At around an intersection of the non-opening regions, the TFT 30 and the storage capacitance 36 illustrated in FIG. 3 are provided. The TFT 30 is provided near the intersection of the non-opening region having a light shielding property to ensure an aperture ratio (aperture area of a pixel) in the opening region. Although a detailed structure of the pixel P will be described below, since the TFT 30 and the storage capacitance 36 are provided near the intersection, widths of the non-opening regions near the intersection are larger than widths of other portions.

The pixel electrode 15 having a substantially square shape in a plan view is provided for each of the pixels P. The pixel electrode 15 is provided in the opening region to overlap to cause an outer edge of the pixel electrode 15 with the non-opening region. A plurality of pixel electrodes 15 are disposed in a matrix shape to correspond to the pixels P.

The liquid crystal apparatus 100 according to the present embodiment is a transmission type as described above, and assumes that light is incident from the side of the counter substrate 20. Therefore, the element substrate 10 (liquid crystal apparatus 100) is provided with a light shielding structure (light shielding film) for shielding not only light directly incident on the TFT 30 but also diffracted light and reflected light derived from the incident light. A structure of the element substrate 10 and the light shielding structure will be described below. Note that an incident direction of the light onto the liquid crystal apparatus 100 is not limited to the side of the counter substrate 20 and the light may be incident from the side of the element substrate 10. In addition, the liquid crystal apparatus 100 may be configured so that light collection means such as a micro lens configured to collect the incident light at each pixel P is provided on the substrate on a side on which the light is incident.

Configuration of Element Substrate

Figure 5:
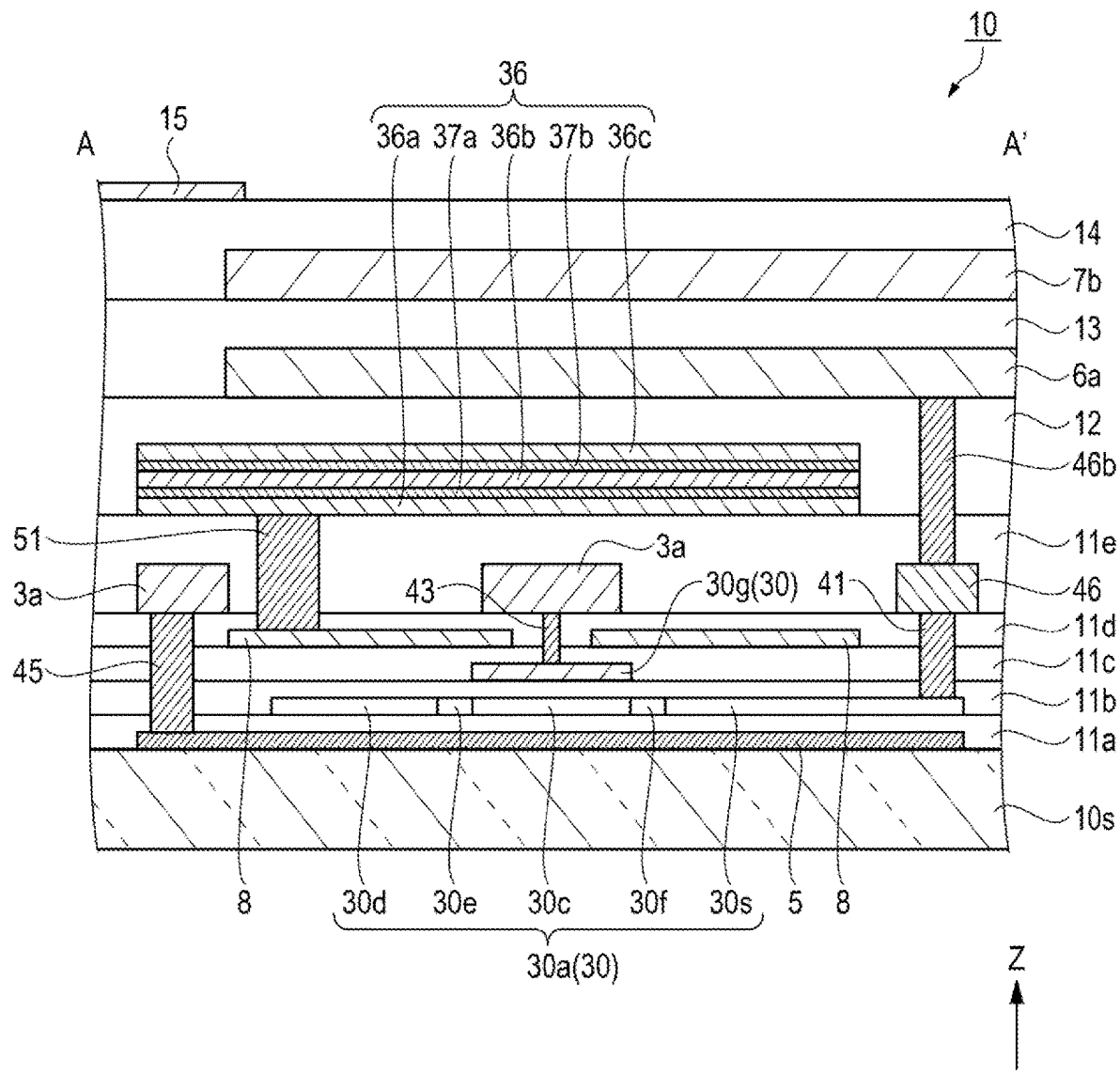
FIG. 5 is a cross-sectional view schematically illustrating a structure of an element substrate taken along line A-A' of FIG. 4.

Firstly, a configuration of a layer of the element substrate 10 configuring the liquid crystal apparatus 100 will be described with reference to FIG. 5. FIG. 5 is a cross-sectional view schematically illustrating a structure of the element substrate taken along line A-A' in FIG. 4. Here, the line A-A' is a line segment crossing the TFT 30, a conductive light-shielding layer, a semiconductor layer, a light shielding film, and the like described later. FIG. 5 illustrates a cross-sectional positional relation of each of the components, and is expressed on a scale for clarity. FIG. 5 does not illustrate the alignment film 18.

As illustrated in FIG. 5, the liquid crystal apparatus 100 includes the TFT 30 as a transistor including a semiconductor layer 30a and a gate electrode 30g, the scan line 3a, and the light shielding film 8. The scan line 3a is electrically coupled to the gate electrode 30g. The light shielding film 8 is electrically coupled to the capacitance line 7b having a constant potential (common potential). A plurality of layers, that is, a first layer to a ninth layer, are layered on the substrate 10s of the element substrate 10.

A plurality of layers provided on the element substrate 10 include, in ascending order, a first layer including the conductive light-shielding layer 5, a second layer including the semiconductor layer 30a, a third layer including the gate electrode 30g, a fourth layer including the light shielding film 8, a fifth layer including the scan line 3a, a sixth layer including the storage capacitance 36, a seventh layer including the data line 6a, an eighth layer including the capacitance line 7b, and a ninth layer including the pixel electrode 15. The conductive light-shielding layer 5 has a function of shielding light incident mainly from a negative Z-direction (below) onto the TFT 30. On the other hand, the light shielding film 8 of the present disclosure has a function of shielding light (stray light) incident mainly from a positive Z-direction onto the TFT 30.

As described above, the scan line 3a is provided in the fifth layer different from the third layer on which the gate electrode 30g is provided. The light shielding film 8 is provided in the fourth layer between the gate electrode 30g (third layer) and the scan line 3a (fifth layer). The light shielding film 8 overlaps with at least a part of a low-concentration drain region 30e of the semiconductor layer 30a, in a plan view from the layering direction of the plurality of layers. Here, "plan view" viewed from the Z-direction is synonymous with a plan view from the layering direction of the plurality of layers.

A base insulating film 11a is disposed between the first layer and the second layer, a gate insulating film 11b is disposed between the second layer and the third layer, a first interlayer insulating film 11c is disposed between the third layer and the fourth layer, a second interlayer insulating film 11d is disposed between the fourth layer and the fifth layer, a third interlayer insulating film 11e is disposed between the fifth layer and the sixth layer, a fourth interlayer insulating film 12 is disposed between the sixth layer and the seventh layer, a fifth interlayer insulating film 13 is disposed between the seventh layer and the eighth layer, and a sixth interlayer insulating film 14 is disposed between the eighth layer and the ninth layer, respectively. This prevents generation of a short circuit between the respective layers.

The conductive light-shielding layer 5 is provided on the first layer on the substrate 10s. Examples of a material for forming the conductive light-shielding layer 5 may include a material having a light shielding property, the material including a metal simple substance, an alloy, metal silicide, and poly-silicide containing at least one kind of high melting point metals such as titanium (Ti), chromium (Cr), W (tungsten), Ta (tantalum), and molybdenum (Mo), a material obtained by stacking these, and a silicon film such as conductive polysilicon or amorphous silicon. The conductive light-shielding layer 5 has a function of shielding light mainly entering from below onto the semiconductor layer 30a. In the present embodiment, the conductive light-shielding layer 5 is patterned and formed by a photolithographic method using tungsten silicide. A thickness of the conductive light-shielding layer 5 is not particularly limited, but is, for example, about 150 nm.

The base insulating film 11a is provided between the conductive light-shielding layer 5 and the second layer. The base insulating film 11a has a function of insulating the conductive light-shielding layer 5 and the TFT 30. In addition, when being formed on an entire surface of the substrate 10s, the base insulating film 11a has a function of preventing a characteristic change of the TFT 30 caused due to roughness during polishing the surface of the substrate 10s and dirt and the like remaining after cleaning. The base insulating film 11a is formed by using silicon oxide (None-doped Silicate Glass: NSG) or silicon nitride. Examples of a method of forming the base insulating film 11a can include an atmospheric pressure CVD method, a low-pressure CVD method, or a plasma CVD method using a processing gas such as monosilane ($SiH_4$), dichlorosilane ($SiCl_2H_2$), Tetra-ethyl Orthosilicate (TEOS), and ammonia. In the present embodiment, silicon oxide is employed as a material for forming the base insulating film 11a. A film thickness of the base insulating film 11a is not particularly limited, but is, for example, about 200 nm.

The TFT 30 is formed on the second layer and the third layer on the first layer. The TFT 30 includes the semiconductor layer 30a provided in the second layer and the gate electrode 30g provided in the third layer. A Lightly Doped Drain (LDD) structure is formed in the semiconductor layer 30a of the TFT 30.

The semiconductor layer 30a is provided to extend in the Y-direction in the second layer. The semiconductor layer 30a includes a polysilicon film obtained by crystallizing an amorphous silicon film deposited by, for example, a low-pressure CVD method. In order to form the polysilicon film by crystallizing the amorphous silicon film, for example, a high temperature treatment of 1000° C. or higher is performed. Impurity ions are selectively injected into the polysilicon film to form a low-concentration source region 30f and the low-concentration drain region 30e, as a channel region 30c, a high-concentration source region 30s, a high-concentration drain region 30d, and a coupling layer (LDD region).

The LDD region with high electrical resistance is formed across the channel region 30c in the semiconductor layer 30a to suppress a leak current at the time of off. From a viewpoint of suppressing a leak current at the time of off, the semiconductor layer 30a may be configured so that the LDD region is included in a joint portion between the high-concentration drain region 30d and the channel region 30c, where the storage capacitance 36 and the pixel electrode 15 are electrically coupled. A film thickness of the semiconductor layer 30a is not particularly limited, but is, for example, about 50 nm.

The gate insulating film 11b is provided to cover the semiconductor layer 30a. The gate insulating film 11b is arranged between the semiconductor layer 30a and the gate electrode 30g to insulate the semiconductor layer 30a and the gate electrode 30g. The gate insulating film 11b includes a double-layer structure including, for example, a first silicon oxide film obtained by thermally oxidizing a semiconductor film of silicon and a second silicon oxide film formed under a high-temperature condition of from 700° C. to 900° C. by using a low-pressure CVD method. A film thickness of the gate insulating film 11b is not particularly limited, but is, for example, about 75 nm.

The gate electrode 30g is provided in the third layer to face the channel region 30c in the Z-direction. The gate electrode 30g is formed by using conductive polysilicon, metal silicide, metal, a metal compound or the like. In the present embodiment, the gate electrode 30g includes a two-layered structure of a conductive polysilicon film and a tungsten silicide film. The conductive polysilicon film is formed to contain phosphorus atoms at concentration of $1 \times 10^{19}$ pieces/cm$^3$ or greater by depositing a polysilicon film doped with P (phosphorus) by a low-pressure CVD method, and subsequently performing a phosphorus diffusion treatment. A film thickness of the gate electrode 30g is not particularly limited, but is, for example, about 150 nm.

Hereinafter, in the present embodiment, the conductive polysilicon film refers to the polysilicon film having conductivity as a result of phosphorus atoms being doped thereto as described above. Note that atoms to be doped are not limited to phosphorus atoms.

The first interlayer insulating film 11c is provided above the gate electrode 30g to cover the gate electrode 30g. The first interlayer insulating film 11c is formed by using, for example, at least one kind of a silicon-based oxide film such as an NSG film, a Phospho Silicate Glass (PSG) film containing phosphorus (P), a Boro Silicate Glass (BSG) film containing boron, and a Boro-Phosphosilicate Glass (BPSG) film containing boron (B) and phosphorus (P).

Examples of a method of forming these silicon-based oxide films can include an atmospheric pressure CVD method, a low-pressure CVD method, and a plasma CVD method using monosilane, dichlorosilane, TEOS, Triethyl Borane (TEB), or the like. In addition, the surface of the first interlayer insulating film 11c has unevenness as a result of covering the TFT 30 including the gate electrode 30g, and thus, in consideration of the patterning of an electrode, a wiring, and the like to be formed thereafter, a flattening treatment such as Chemical Mechanical processing (Chemical & Mechanical Polishing: CMP treatment) and the like to alleviate the unevenness are applied. A film thickness of the first interlayer insulating film 11c obtained after the flattening treatment is not particularly limited, but is, for example, about 200 nm.

The light shielding film 8 is provided on the fourth layer on the third layer. The light shielding film 8 is provided to overlap with at least, in a plan view, the high-concentration source region 30s, the high-concentration drain region 30d, the low-concentration source region 30f, and the low-concentration drain region 30e, in the semiconductor layer 30a. Therefore, the light shielding property for shielding the light incident onto the semiconductor layer 30a from above is secured by the light shielding film 8. The light shielding film 8 is electrically coupled to a below-described capacitance lower electrode 36a of the storage capacitance 36. Constant potential is applied to the light shielding film 8 via the capacitance lower electrode 36a. This reduces an influence of the gate potential in the scan line 3a provided in the fifth layer. Further, as compared with a case where a wiring having a gate potential is used as a light shielding film, an off-leak current in the TFT 30 can be reduced even if the light shielding film 8 is disposed close to the semiconductor layer 30a.

A material for forming the light shielding film 8 is not particularly limited as long as the material has conductivity and light shielding property, and examples of the material include a low resistance metal such as aluminum (Al), Titanium (Ti), and titanium nitride (TiN). In the present embodiment, the light shielding film 8 is formed by using titanium nitride (TiN). By using titanium nitride for the light shielding film 8, light in a visible light wavelength range is easily absorbed as compared with a case where titanium is used, for example. For this reason, reflected light from the light shielding film 8 can be reduced. A film thickness of the light shielding film 8 is not particularly limited, but is, for example, about 100 nm.

The second interlayer insulating film 11d is provided to cover the light shielding film 8. An example of a material for forming the second interlayer insulating film 11d includes a silicon-based oxide film similar to the first interlayer insulating film 11c. In the present embodiment, silicon oxide is employed for the second interlayer insulating film 11d. A film thickness of the second interlayer insulating film 11d is not particularly limited, but is, for example, about 300 nm.

Contact holes 41, 43, 45 and the like are provided in the second interlayer insulating film 11d. The contact hole 43 penetrates the second interlayer insulating film 11d and the first interlayer insulating film 11c and is electrically coupled to the gate electrode 30g. The contact hole 45 penetrates from the base insulating film 11a to the second interlayer insulating film 11d and is electrically coupled to the conductive light-shielding layer 5. The contact hole 41 penetrates from the gate insulating film 11b to the second interlayer insulating film 11d and is electrically coupled to the high-concentration source region 30s of the semiconductor layer 30a. Although not illustrated in FIG. 5, in the high-concentration drain region 30d of the semiconductor layer 30a, a contact hole electrically coupled to a below-described capacitance intermediate electrode 36b of the storage capacitance 36 is provided. After a through-hole is formed by dry-etching an interlayer insulating film, the contact holes 41, 43, 45 and the like are formed to fill the through-hole, together with a conductive film (wiring) electrically coupled in an upper layer, for example.

The scan line 3a and a relay layer 46 are provided on the fifth layer on the fourth layer. The scan line 3a is electrically coupled with the contact holes 43 and 45. Therefore, the scan line 3a is electrically coupled to the gate electrode 30g and the conductive light-shielding layer 5. The relay layer 46 is formed in an island shape and is electrically coupled to the contact hole 41. Therefore, the relay layer 46 is electrically coupled to the high-concentration source region 30s of the semiconductor layer 30a.

A material for forming the scan line 3a and the relay layer 46 is not particularly limited as long as the material is any low resistance wiring material having conductivity, and examples of the material include a metal such as aluminum (Al) and titanium (Ti) and a metal compound thereof. In the present embodiment, the scan line 3a and the relay layer 46 have a four-layered structure of a titanium (Ti) layer/a titanium nitride (TiN) layer/an aluminum (Al) layer/a titanium nitride (TiN) layer. Film thicknesses of the scan line 3a and the relay layer 46 are not particularly limited, but are, for example, about 250 nm.

The third interlayer insulating film 11e is provided to cover the scan line 3a and the relay layer 46. An example of a material for forming the third interlayer insulating film 11e includes a silicon-based oxide film similar to the first interlayer insulating film 11c. In the present embodiment, silicon oxide is employed for the third interlayer insulating film 11e. Unevenness is easily generated due to the wiring structure in the lower layer on the surface after the film formation in the third interlayer insulating film 11e. For this reason, for example, flattening treatment such as CMP treatment is performed. A film thickness of the third interlayer insulating film 11e obtained after the flattening treatment is, for example, about 300 nm.

A contact hole 51 is provided in the third interlayer insulating film 11e. The contact hole 51 penetrates the second interlayer insulating film 11d and the third interlayer insulating film 11e and is electrically coupled to the light shielding film 8. After a through-hole is formed by dry-etching the second interlayer insulating film 11d and the third interlayer insulating film 11e, the contact hole 51 is formed to fill the through-hole, together with the capacitance lower electrode 36a electrically coupled in an upper layer.

The storage capacitance 36 is provided on the sixth layer on the fifth layer. The capacitance lower electrode 36a, a dielectric layer 37a, the capacitance intermediate electrode 36b, a dielectric layer 37b, and a capacitance upper electrode 36c are layered in order from the substrate 10s being a lower layer to the upper layer (in the Z-direction) in the storage capacitance 36. The storage capacitance 36 includes a first storage capacitance including the capacitance lower electrode 36a, the dielectric layer 37a, and the capacitance intermediate electrode 36b, and a second storage capacitance including the capacitance intermediate electrode 36b, the dielectric layer 37b, and the capacitance upper electrode 36c.

The storage capacitance 36 has a function of improving a potential holding characteristic in the pixel electrode 15. The storage capacitance 36 is provided to be stored in the non-opening region (see FIG. 4) in a plan view, which will be described in detail later.

A conductive film made of titanium nitride or the like is formed on the third interlayer insulating film 11e, and then the conductive film is patterned to form the capacitance lower electrode 36a. The capacitance lower electrode 36a is electrically coupled to the contact hole 51. Therefore, the capacitance lower electrode 36a and the light shielding film 8 are electrically coupled through the contact hole 51. A film thickness of the capacitance lower electrode 36a is not particularly limited, but is, for example, 50 nm.

On the capacitance lower electrode 36a, the dielectric layer 37a is provided to cover the capacitance lower electrode 36a. The dielectric layer 37a includes a plurality of layers formed by using dielectric materials having different dielectric constants. Examples of the dielectric material include hafnium oxide, aluminum oxide, silicon oxide, silicon nitride, and tantalum oxide, and these are used in combination. A plurality of layers having different dielectric constants are combined to secure a larger electric capacity as compared with a single layer.

In the dielectric layer 37a of the present embodiment, a multilayer film in which hafnium oxide having a high dielectric constant and aluminum oxide excellent in pressure resistance are stacked in this order is adopted. Note that a part of the capacitance lower electrode 36a is not covered with the dielectric layers 37a and 37b and the capacitance intermediate electrode 36b being upper layers, and is electrically coupled to the capacitance upper electrode 36c via a coupling portion, which will be described in detail later. Further, the capacitance upper electrode 36c is electrically coupled to the capacitance line 7b in the eighth layer through the contact hole.

On the dielectric layer 37a, the capacitance intermediate electrode 36b is provided to cover the dielectric layer 37a. Similarly to the capacitance lower electrode 36a, a conductive film made of titanium nitride or the like is formed, and then the conductive film is patterned to form the capacitance intermediate electrode 36b. As described above, the capacitance intermediate electrode 36b is electrically coupled to the high-concentration drain region 30d of the semiconductor layer 30a via a contact hole (not illustrated). A film thickness of the capacitance intermediate electrode 36b is not particularly limited, but is, for example, 50 nm.

On the capacitance intermediate electrode 36b, the dielectric layer 37b is provided to cover the capacitance intermediate electrode 36b. A forming material similar to that of the dielectric layer 37a can be employed for the dielectric layer 37b. A multilayer film including a hafnium oxide layer and an aluminum oxide layer is employed in the dielectric layer 37b of the present embodiment, similarly to the dielectric layer 37a. A part of the capacitance intermediate electrode 36b is not covered with the dielectric layers 37b and the capacitance upper electrode 36c being upper layers, and is electrically coupled to the pixel electrode 15 via a contact hole, which will be described in detail later.

On the dielectric layer 37b, the capacitance upper electrode 36c is provided to cover the dielectric layer 37b. Similarly to the capacitance lower electrode 36a, a conductive film made of titanium nitride or the like is formed, and then the conductive film is patterned to form the capacitance upper electrode 36c. A film thickness of the capacitance upper electrode 36c is not particularly limited, but is, for example, 100 nm.

The fourth interlayer insulating film 12 is provided to cover the storage capacitance 36. An example of a material for forming the fourth interlayer insulating film 12 includes a silicon-based oxide film similar to the first interlayer insulating film 11c. In the present embodiment, silicon oxide is employed for the fourth interlayer insulating film 12. Unevenness is easily generated due to the storage capacitance 36 in the lower layer and the like on the surface after the film formation in the fourth interlayer insulating film 12. For this reason, for example, flattening treatment such as CMP treatment is performed. A film thickness of the fourth interlayer insulating film 12 after the flattening treatment is not particularly limited but is, for example, about 400 nm.

A contact hole 46b is provided in the fourth interlayer insulating film 12. The contact hole 46b penetrates the third interlayer insulating film 11e and the fourth interlayer insulating film 12 and is electrically coupled to the relay layer 46. After a through-hole is formed by dry-etching the third interlayer insulating film 11e and the fourth interlayer insulating film 12, the contact hole 46b is formed to fill the through-hole, together with the data lines 6a electrically coupled in an upper layer.

On the seventh layer on the sixth layer, the data line 6a is provided. The data line 6a extends in the Y-direction in the non-opening region (see FIG. 4) of the pixel P, as described above. The data line 6a is electrically coupled to the contact hole 46b. Therefore, the data line 6a is electrically coupled to the high-concentration source region 30s of the semiconductor layer 30a, through the contact hole 46b, the relay layer 46, and the contact hole 41.

A material for forming the data lines 6a is not particularly limited as long as the material is any low resistance wiring material having conductivity, and examples thereof include a metal such as aluminum (Al) and titanium (Ti) and a metal compound thereof. In the present embodiment, the data line 6a has a four-layered structure of a titanium (Ti) layer/a titanium nitride (TiN) layer/an aluminum (Al) layer/a titanium nitride (TiN) layer. A film thickness of the data line 6a is not particularly limited, but is, for example, about 350 nm.

The fifth interlayer insulating film 13 is provided to cover the data line 6a. An example of a material for forming the fifth interlayer insulating film 13 includes a silicon-based oxide film similar to the first interlayer insulating film 11c. In the present embodiment, silicon oxide is employed for the fifth interlayer insulating film 13. Unevenness is easily generated due to the wiring structure in the lower layer on the surface after the film formation in the fifth interlayer insulating film 13. For this reason, for example, flattening treatment such as CMP treatment is performed. A film thickness of the fifth interlayer insulating film 13 after the flattening treatment is not particularly limited but is, for example, about 400 nm.

On the eighth layer on the seventh layer, the capacitance line 7b is provided. The capacitance line 7b is provided to overlap with the data line 6a extending in the Y-direction and the scan line 3a extending in the X-direction in a plan view. Although not illustrated, the capacitance line 7b is electrically coupled to the vertical conduction portion 106 of the counter substrate 20. Therefore, the capacitance line 7b is electrically coupled to the counter electrode 21 to receive a common potential. As a result, the capacitance line 7b prevents an influence of the potential of the scan line 3a or the data line 6a from reaching the pixel electrode 15.

A material for forming the capacitance lines 7b is not particularly limited as long as the material is any low resistance wiring material having conductivity, and examples thereof include a metal such as aluminum (Al) and titanium (Ti) and a metal compound thereof, similarly to the data lines 6a. In the present embodiment, the capacitance lines 7b has a four-layered structure of a titanium (Ti) layer/a titanium nitride (TiN) layer/an aluminum (Al) layer/a titanium nitride (TiN) layer. A film thickness of the capacitance line 7b is not particularly limited, but is, for example, about 250 nm.

The sixth interlayer insulating film 14 is provided to cover the capacitance lines 7b. An example of a material for forming the sixth interlayer insulating film 14 includes a silicon-based oxide film similar to the first interlayer insulating film 11c. In the present embodiment, silicon oxide is employed for the sixth interlayer insulating film 14. Unevenness is easily generated due to the wiring structure in the lower layer on the surface after the film formation in the sixth interlayer insulating film 14. For this reason, for example, flattening treatment such as CMP treatment is performed. A film thickness of the sixth interlayer insulating film 14 after the flattening treatment is not particularly limited but is, for example, about 300 nm.

On the ninth layer on the eighth layer, the pixel electrode 15 is provided. The pixel electrode 15 is formed by being patterned after a transparent conductive film made of IZO, ITO, or the like is formed. In the present embodiment, ITO is employed for the pixel electrode 15. The pixel electrode 15 is electrically coupled to the capacitance intermediate electrode 36b via a below-described contact hole. A film thickness of the pixel electrode 15 is not particularly limited, but is, for example, about 145 nm.

The alignment film 18 is provided to cover the pixel electrode 15. The alignment film 18 of the element substrate 10 and the alignment film 22 of the counter substrate 20 (see FIG. 22) are formed of an aggregate of columns grown in a columnar shape by deposing an inorganic material such as silicon oxide from a predetermined direction (diagonal direction, for example).

Liquid crystal molecules included in the liquid crystal layer 50 (see FIG. 2) have a negative dielectric anisotropy for the alignment films 18 and 22. Therefore, the liquid crystal molecules are approximately vertically aligned Vertical Alignment: (VA) with a pretilt Angle θp of 3° to 5° in an inclined direction of the column with respect to a normal direction of an alignment film surface. An alternating voltage (a drive signal, an AC signal) is applied between the pixel electrode 15 and the counter electrode 21 (see FIG. 2) to drive the liquid crystal layer 50, so that the liquid crystal molecules behave (vibrate) to be inclined in a direction of an electric field generated between the pixel electrode 15 and the counter electrode 21. In the present embodiment, a nematic liquid crystal having a nematic-isotropic phase transition temperature (Tni) of 110° C. is used as the liquid crystal having a negative dielectric anisotropy.

Light Shielding Structure of Element Substrate

Figure 6:
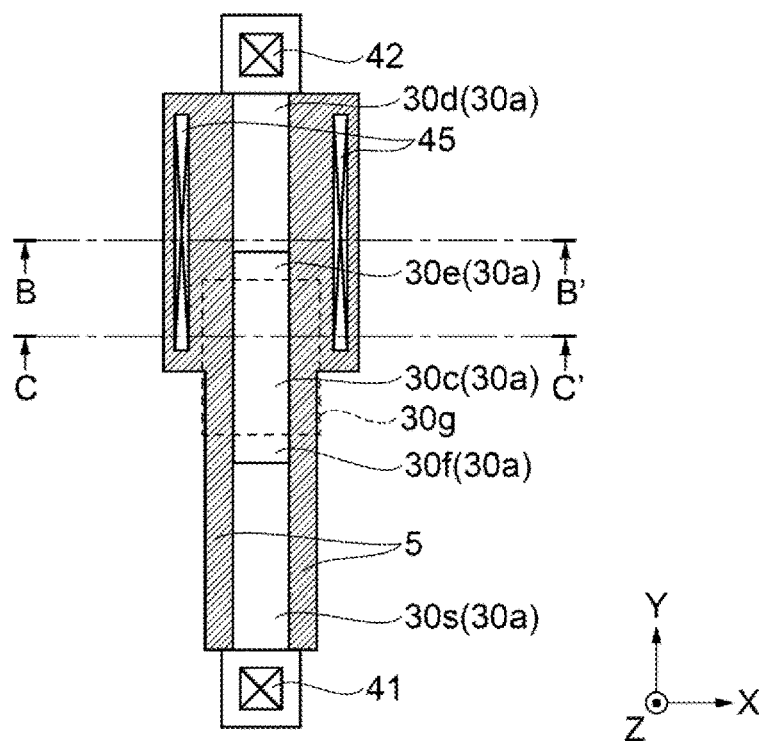
FIG. 6 is a plan view schematically illustrating disposition of main parts in each layer of the element substrate.
Figure 12:
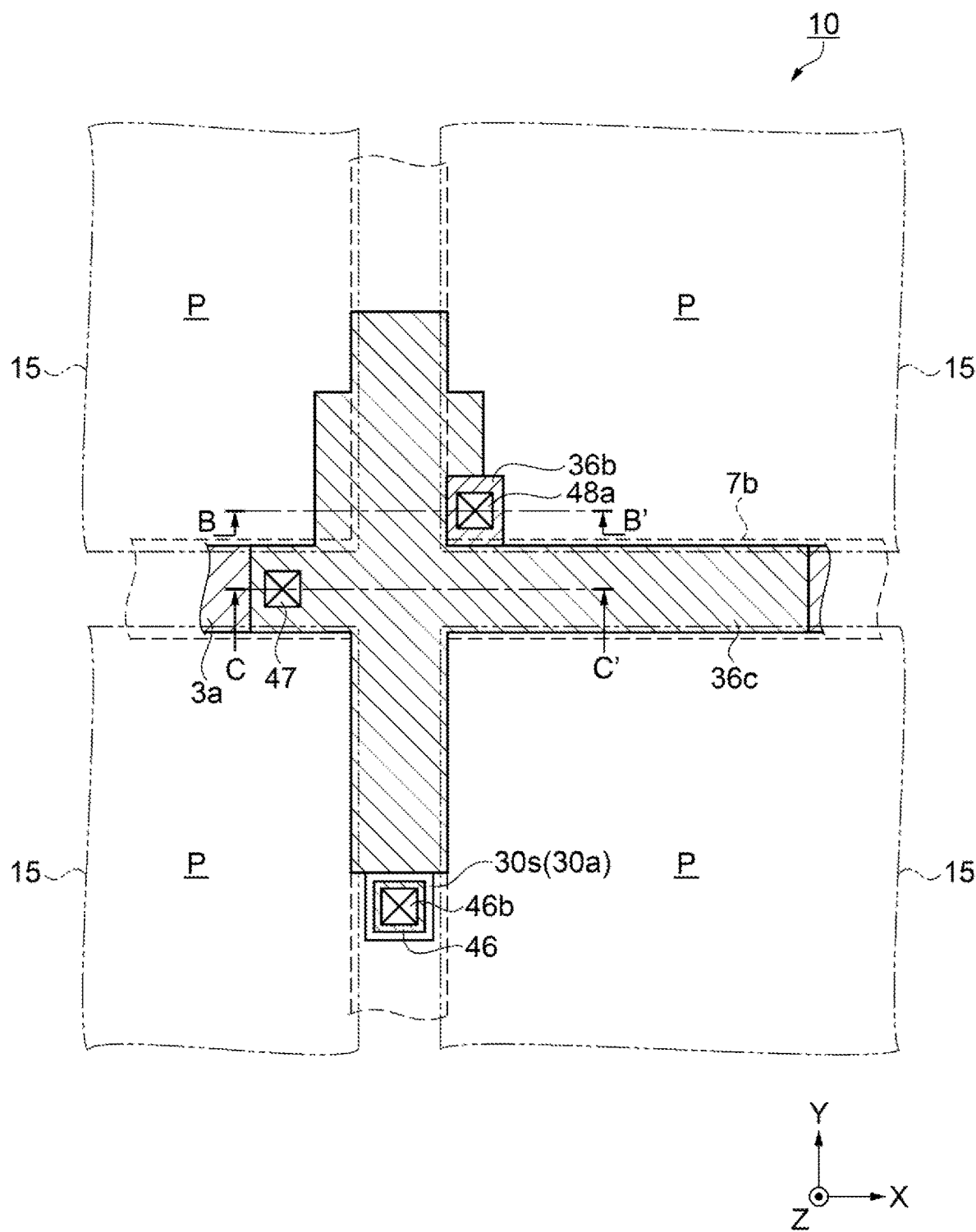
FIG. 12 is a plan view schematically illustrating disposition of main parts in each layer of the element substrate.
Figure 13:
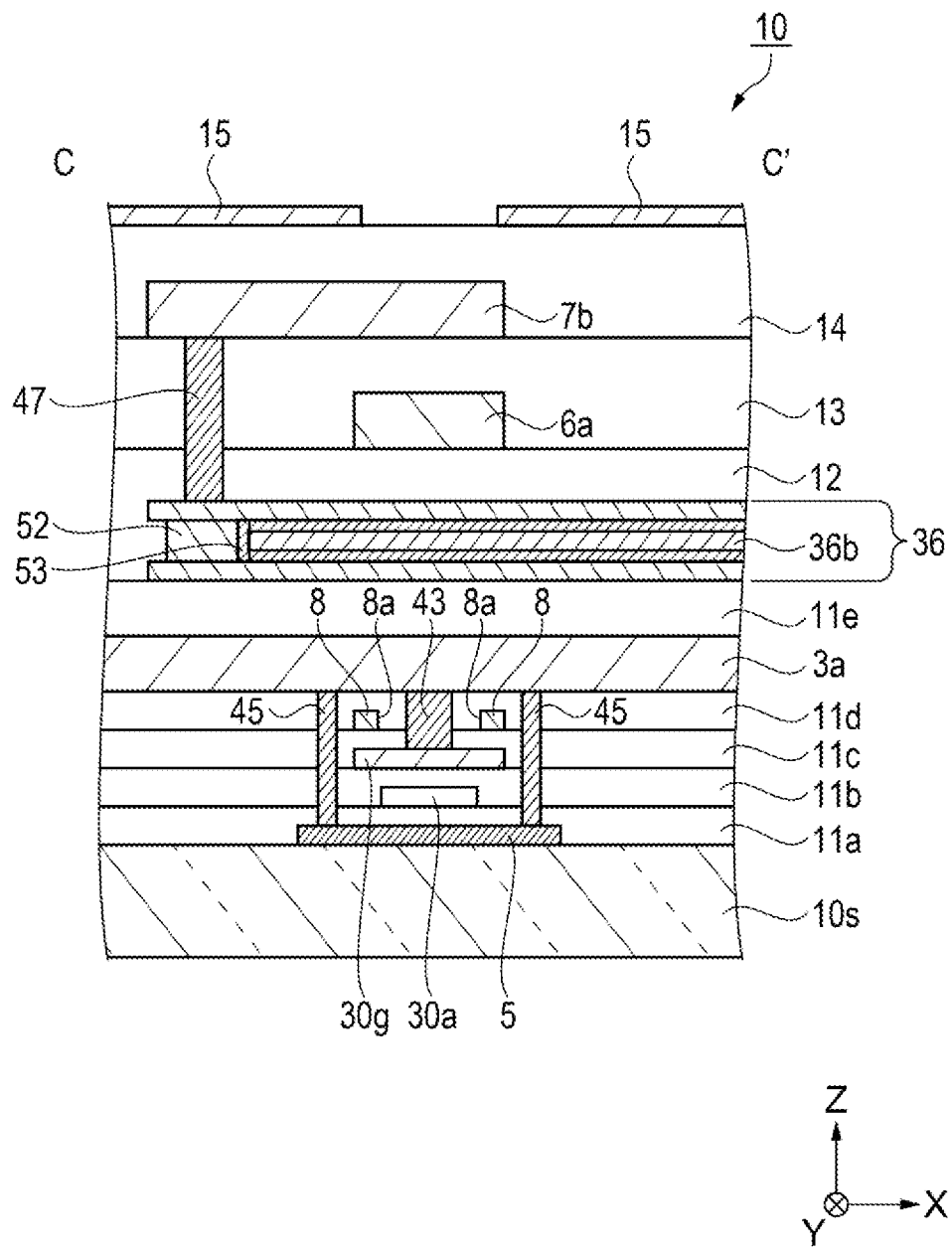
FIG. 13 is a cross-sectional view schematically illustrating a structure of the element substrate taken along line C-C' of FIG. 4.
Figure 14:
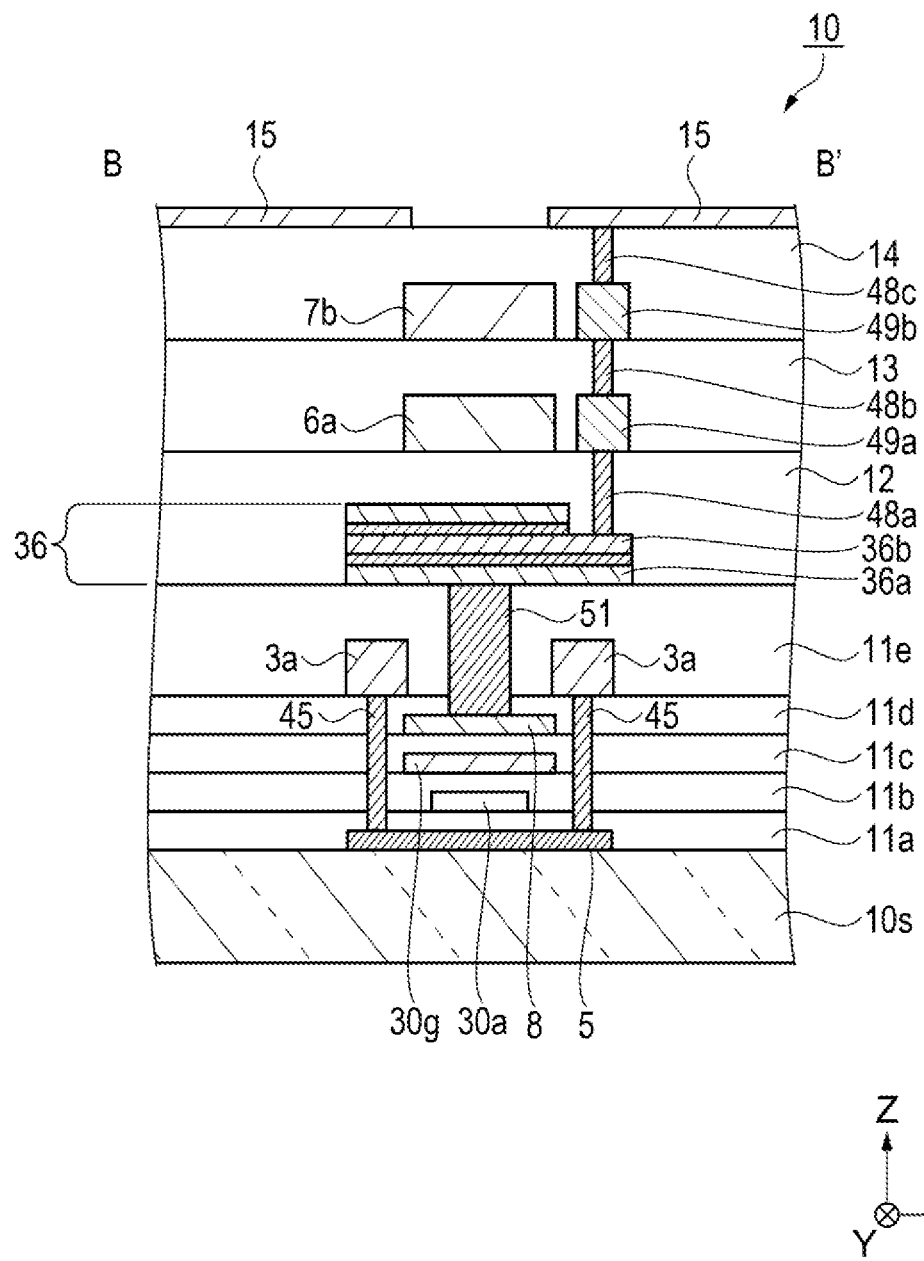
FIG. 14 is a cross-sectional view schematically illustrating a structure of the element substrate taken along line B-B' of FIG. 4.

Next, a light shielding structure of the element substrate 10 will be described with reference to FIG. 6 to FIG. 14. FIG. 6 from FIG. 12 are plan views each schematically illustrating disposition of main parts in each layer of the element substrate. FIG. 13 is a cross-sectional view schematically illustrating a structure of the element substrate taken along line C-C' in FIG. 4. FIG. 14 is a cross-sectional view schematically illustrating a structure of the element substrate taken along line B-B' in FIG. 4. The line C-C' is a segment crossing the conductive light-shielding layer 5, the semiconductor layer 30a, an opening portion 8a, the light shielding film 8, the gate electrode 30g, the contact holes 43 and 47, and the like. The line B-B' is a segment crossing the conductive light-shielding layer 5, the semiconductor layer 30a, the contact holes 45, 51, the light shielding film 8, the scan line 3a, and the like.

In FIG. 6 to FIG. 12, the non-opening region between the pixels P adjacent along the X-direction is enlarged and illustrated in a plan view, and illustration of the base insulating film 11a, the gate insulating film 11b, the first to sixth interlayer insulating films, and the like is omitted. In FIG. 13 and FIG. 14, a cross-sectional positional relation of each of the components is expressed on a scale for clarity, and illustration of the alignment film 18 is omitted.

FIG. 6 illustrates a state where the conductive light-shielding layer 5 (first layer) and the semiconductor layer 30a (second layer) are viewed from above. The gate electrode 30g (third layer) facing the channel region 30c of the semiconductor layer 30a in the Z-direction is illustrated with a broken line.

As illustrated in FIG. 6, the conductive light-shielding layer 5 and the semiconductor layer 30a are disposed to be overlapped along the Y-direction. Both the conductive light-shielding layer 5 and the semiconductor layer 30a are elongated in the Y-direction, and the conductive light-shielding layer 5 has a width larger than the semiconductor layer 30a. A pair of contact holes 45 are coupled to the conductive light-shielding layer 5. The pair of contact holes 45 sandwich a part of the high-concentration drain region 30a, the low-concentration drain region 30e, and a part of the channel region 30c, of the semiconductor layer 30a, in the X-direction. To arrange the pair of contact holes 45, the conductive light-shielding layer 5 has a larger width in the X-direction, from the high-concentration drain region 30d to the channel region 30c.

The pair of contact holes 45 have an elongated rectangular cross-section in the XY plane. As illustrated in FIG. 13 and FIG. 14, the pair of contact holes 45 electrically couple the conductive light-shielding layer 5 and the scan line 3a of the fifth layer. The pair of contact holes 45 are extended upward in a wall shape with interposing a part of the high-concentration drain region 30d, the low-concentration drain region 30e, and a part of the channel region 30c. Therefore, the pair of contact holes 45 can reduce (shield) light incident onto the semiconductor layer 30a mainly from a direction crossing the Z-direction.

Now, returning to FIG. 6, the contact holes 41 and 42 are coupled to both ends in the Y-direction of the semiconductor layer 30a. Therefore, a width in the X-direction at the both ends in the Y-direction of the semiconductor layer 30a is formed to be wider than a width in the X-direction between the high-concentration drain region 30d and the high-concentration source region 30s. Here, although not illustrated in FIG. 6, the conductive light-shielding layer 5 is provided also below the both ends in the Y-direction of the semiconductor layer 30a to which the contact holes 41 and 42 are coupled. In other words, in a region overlapping with the semiconductor layer 30a in a plan view, the conductive light-shielding layer 5 is disposed in a lower layer. As a result, light incident mainly from below onto the semiconductor layer 30a can be shielded.

Further, as illustrated with a broken line in FIG. 6, the gate electrode 30g is provided on the third layer to face the channel region 30c in the Z-direction. In the Y-direction, the gate electrode 30g overlaps with the channel region 30c of the semiconductor layer 30a.

Figure 7:
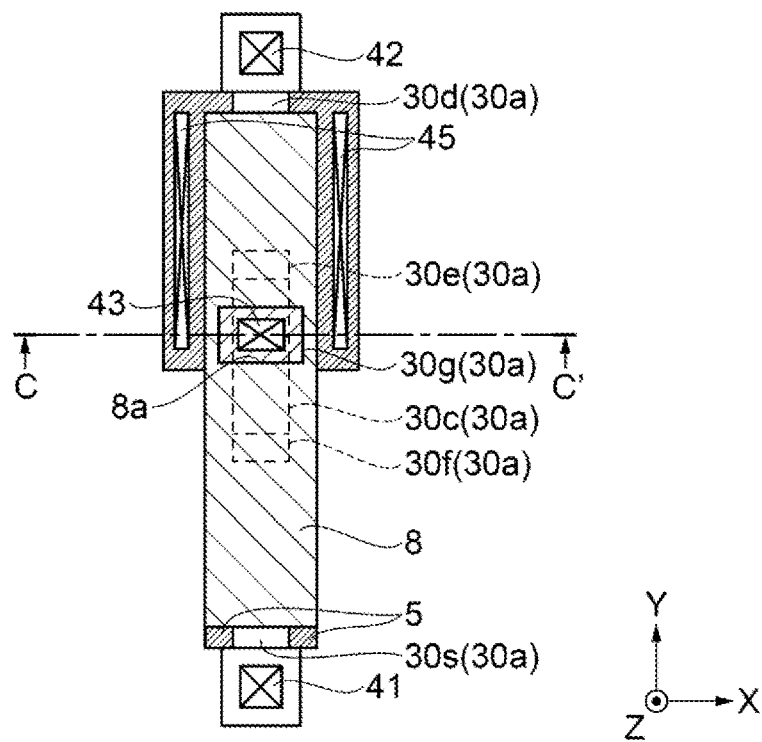
FIG. 7 is a plan view schematically illustrating disposition of main parts in each layer of the element substrate.

FIG. 7 illustrates a state where the conductive light-shielding layer 5 (first layer) to the light shielding film 8 (fourth layer) are viewed from above. That is, in FIG. 7, the gate electrode 30g, the contact hole 43, and the light shielding film 8 are added to the configuration of FIG. 6. Note that, in FIG. 7, below the light shielding film 8, the low-concentration drain region 30e is indicated with a dotted line, the channel region 30c is indicated with a broken line with one dot, and the low-concentration source region 30f is indicated with a dashed line, respectively transparently.

The light shielding film 8 is an example of a light shielding structure of the present disclosure. As illustrated in FIG. 7, the light shielding film 8 has an elongated shape in the Y-direction and is provided to overlap with an approximately entire region of the semiconductor layer 30a in a plan view. More specifically, the light shielding film 8 covers a boundary between the low-concentration drain region 30e and the channel region 30c (gate electrode 30g), a boundary between the low-concentration drain region 30e, and the low-concentration source region 30f and the channel region 30c, and an area above the low-concentration source region 30f and the like. In particular, the light shielding film 8 overlaps with at least a part of the boundary between the low-concentration drain region 30e and the gate electrode 30g. The light shielding film 8 is larger in width in the X-direction than the semiconductor layer 30a, and can shield the light incident from above onto the semiconductor layer 30a.

In the light shielding film 8, somewhere in the Y-direction, an approximately rectangular opening portion 8a is provided at a position overlapping the gate electrode 30g. The opening portion 8a overlaps with the channel region 30c in a plan view. The opening portion 8a includes the contact hole 43 as a gate contact electrically coupling the gate electrode 30g and the scan line 3a. That is, as illustrated in FIG. 13, the gate electrode 30g is electrically coupled to the scan line 3a through the contact hole 43 passing through the opening portion 8a.

Returning to the FIG. 7, the opening portion 8a is surrounded by the light shielding film 8 in a plan view. In other words, the light shielding film 8 is also provided on both sides of the opening portion 8a in the X-direction. Therefore, the light incident onto the semiconductor layer 30a from both sides in the X-direction of the contact hole 43 can be shielded. Here, a shape of the opening portion 8a in a plan view is not limited to an approximately rectangular shape. The shape of the opening portion 8a in a plan view may be a circle, an ellipse, a polygon and the like.

Figure 8:
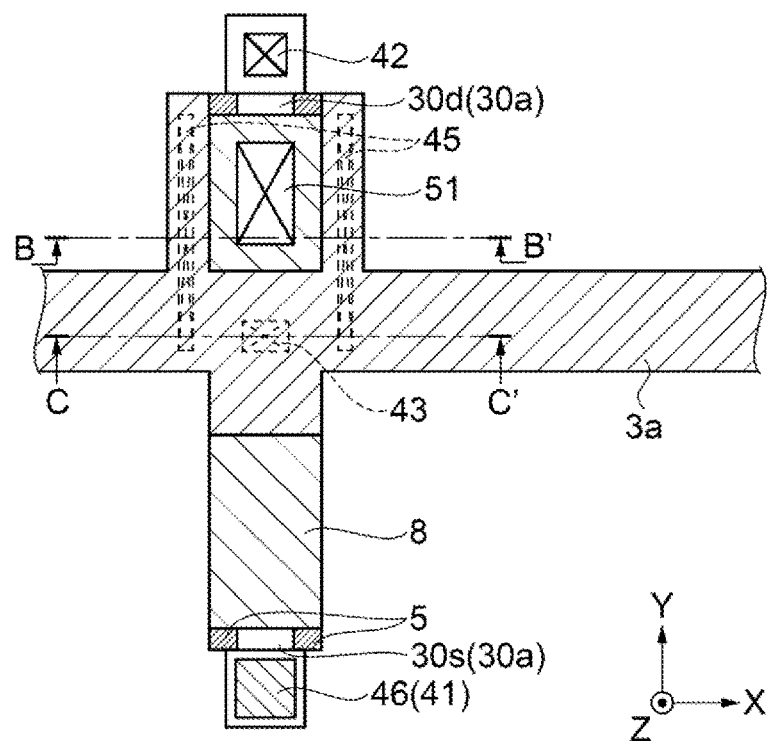
FIG. 8 is a plan view schematically illustrating disposition of main parts in each layer of the element substrate.

FIG. 8 illustrates a state where the conductive light-shielding layer 5 (first layer) to the scan line 3a (fifth layer) are viewed from above. That is, in FIG. 8, the scan line 3a, the relay layer 46, and the contact hole 51 are added to the configuration of FIG. 7. Note that, in FIG. 8, the contact holes 43 and 45 below the scan lines 3a are illustrated transparently with a broken line, respectively.

As illustrated in FIG. 8, the contact hole 51 is coupled to a side of the high-concentration drain region 30d of the light shielding film 8. The scan line 3a extends along the X-direction and has a pair of projections for coupling with the pair of contact holes 45. The pair of projections project in a positive Y-direction and face each other in the X-direction with the contact hole 51 being interposed therebetween. Further, the scan line 3a is provided to partially project in a negative Y-direction to overlap with the channel region 30c (see FIG. 7). Note that as described above, the contact hole 41 is electrically coupled to the relay layer 46.

As illustrated in FIG. 13 and FIG. 14, the gate electrode 30g and the scan line 3a are electrically coupled through the contact hole 43. In addition, through the pair of contact holes 45, the conductive light-shielding layer 5 and the scan line 3a are electrically coupled. Further, as illustrated in FIG. 14, through the contact hole 51 passing between the pair of projections, the light shielding film 8 and the capacitance lower electrode 36a in the sixth layer are electrically coupled.

Figure 9:
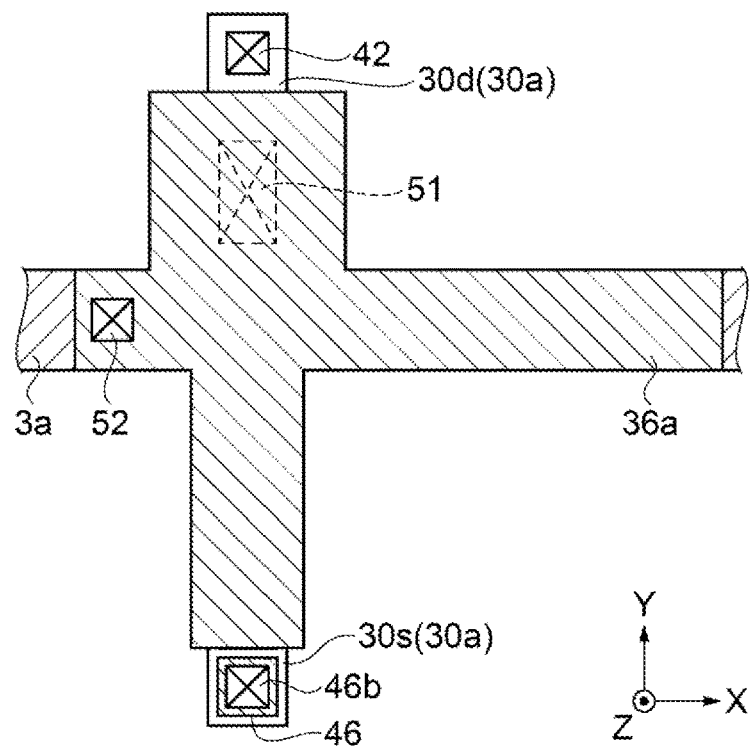
FIG. 9 is a plan view schematically illustrating disposition of main parts in each layer of the element substrate.

FIG. 9 illustrates a state where the conductive light-shielding layer 5 (first layer) to the capacitance lower electrode 36a (sixth layer) are viewed from above. That is, in FIG. 9, the capacitance lower electrode 36a, a coupling portion 52, and the contact hole 46b are added to the configuration of FIG. 8. In FIG. 9, the contact hole 51 below the capacitance lower electrode 36a is indicated transparently with a broken line.

As illustrated in FIG. 9, the capacitance lower electrode 36a extends along the X-direction, and overlaps with the semiconductor layer 30a (conductive light-shielding layer 5) except for a region where the contact hole 42 and the relay layer 46 are provided. In the capacitance lower electrode 36a, the coupling portion 52 is provided at one side end (the negative X-direction side of a region overlapping with the semiconductor layer 30a) extending in the X-direction. The contact hole 46b is coupled to the relay layer 46.

Figure 10:
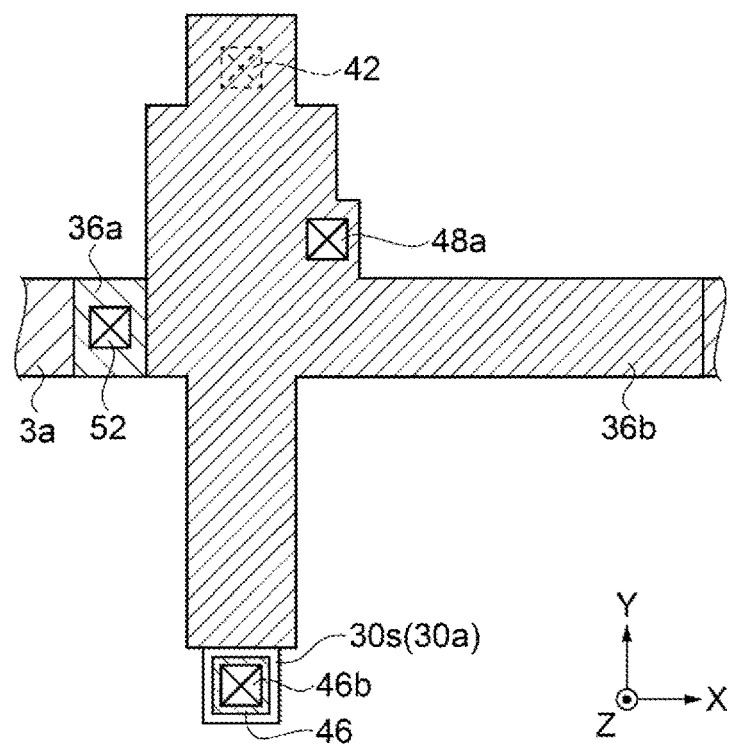
FIG. 10 is a plan view schematically illustrating disposition of main parts in each layer of the element substrate.

FIG. 10 illustrates a state where the conductive light-shielding layer 5 (first layer) to the capacitance intermediate electrode 36b (sixth layer) are viewed from above. That is, in FIG. 10, the capacitance intermediate electrode 36b and a contact hole 48a are added to the configuration of FIG. 9. In FIG. 10, the contact hole 42 below the capacitance intermediate electrode 36b is indicated transparently with a broken line.

As illustrated in FIG. 10, the capacitance intermediate electrode 36b extends to an opposite side (the positive X-direction side) of the coupling portion 52 along the X-direction. The capacitance intermediate electrode 36b extends also in the Y-direction, and overlaps with the semiconductor layer 30a except for a region where the contact hole 41 is provided in a plan view. Therefore, the contact hole 42 and the capacitance intermediate electrode 36b are coupled. That is, the capacitance intermediate electrode 36b is electrically coupled to the high-concentration drain region 30d of the semiconductor layer 30a (see FIG. 9) through the contact hole 42. In addition, the contact hole 48a is coupled to the capacitance intermediate electrode 36b at a position where a region extending in the positive X-direction and a region extending in the positive Y-direction cross.

Figure 11:
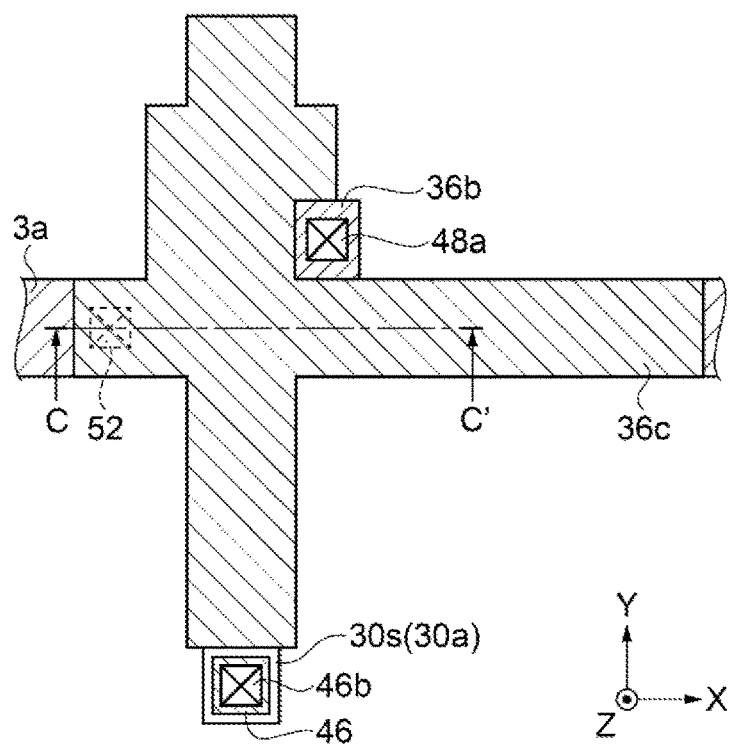
FIG. 11 is a plan view schematically illustrating disposition of main parts in each layer of the element substrate.

FIG. 11 illustrates a state where the conductive light-shielding layer 5 (first layer) to the capacitance upper electrode 36c (sixth layer) are viewed from above. That is, in FIG. 11, the capacitance upper electrode 36c is added to the configuration of FIG. 10. Note that, in FIG. 11, the coupling portion 52 below the capacitance upper electrode 36c is indicated transparently with a broken line.

As illustrated in FIG. 11, a notch is provided in a region where the contact hole 48a is formed in a plan view, and the capacitance upper electrode 36c overlaps with the capacitance intermediate electrode 36b except for the region with the notch. In addition, the capacitance upper electrode 36c overlaps also with a region where the coupling portion 52 of the capacitance lower electrode 36a is formed, and is coupled to the coupling portion 52. Therefore, as illustrated in FIG. 13, the capacitance lower electrode 36a and the capacitance upper electrode 36c are electrically coupled through the coupling portion 52. Further, between the coupling portion 52 and the capacitance intermediate electrode 36b, a dielectric portion 53 is provided to prevent contact between the coupling portion 52 and the capacitance intermediate electrode 36b. The dielectric portion 53 is formed of a forming material similar to that of the dielectric layers 37a and 37b (see FIG. 5).

In FIG. 12, a contact hole 47 is added to the configuration of FIG. 11, and in FIG. 12, the capacitance lines 7b of the eighth layer is indicated with a broken line and the pixel electrode 15 of the ninth layer is indicated with a dashed line with two dots. As illustrated in FIG. 12, the capacitance upper electrode 36c is coupled with the contact hole 47 at a position overlapping with the coupling portion 52 (see FIG. 11) in a plan view. In the element substrate 10, by the above configuration, the non-opening region is formed between the adjacent pixels P. The capacitance line 7b extends in the X-direction and the Y-direction to overlap with the non-opening region (see FIG. 4), and is provided in a lattice shape around the pixels P. In addition, although not illustrated in FIG. 12, the data line 6a extends in the Y-direction and the scan line 3a extends in the X-direction to overlap with the capacitance line 7b, respectively.

As illustrated in FIG. 13, the capacitance upper electrode 36c and the capacitance lines 7b (eighth layer) are electrically coupled through the contact hole 47. As described above, since a common potential is applied to the capacitance line 7b, the common potential is also applied to the capacitance upper electrode 36c, the capacitance lower electrode 36a, and the light shielding film 8 which are electrically coupled to the capacitance line 7b. Therefore, the light shielding film 8 to which the common potential is applied is interposed between the scan line 3a and the semiconductor layer 30a. In other words, a common potential or potential different from those in the gate electrode 30g, and the high-concentration source region 30s and the high-concentration drain region 30d of the semiconductor layer 30a is applied to the light shielding film 8. The potential applied to the light shielding film 8 is not limited to the common potential, and may be, for example, the same potential as that of the ground wiring.

With such a light shielding structure, even if the light shielding film 8 is arranged closer to the semiconductor layer 30a than before, an off-leak current hardly increases. In addition, as compared with a case where no light shielding film 8 is provided, a distance in the Z-direction between the scan line 3a and the semiconductor layer 30a is increased. Therefore, an influence of the potential of the scan line 3a upon the semiconductor layer 30a can be further reduced. In the contact hole 47, for example, a relay layer may be provided in the seventh layer.

As illustrated in FIG. 14, the contact holes 48a, 48b, and 48c are formed to penetrate the fourth interlayer insulating film 12, the fifth interlayer insulating film 13, and the sixth interlayer insulating film 14, respectively. The contact holes 48a, 48b, and 48c electrically couple the capacitance intermediate electrode 36b and the pixel electrode 15 through a relay layer 49a of the seventh layer and a relay layer 49b of the eighth layer. For the relay layers 49a and 49b, a forming material similar to those of the data line 6a and the capacitance line 7b is employed.

As described above, based on the liquid crystal apparatus 100 according to the present embodiment, the following effects can be obtained.

It is possible to realize a light shielding structure with a reduced off-leak current in the TFT 30. More specifically, the light shielding film 8 overlaps with the semiconductor layer 30a including the low-concentration drain region 30e, and thus, the light shielding property for the semiconductor layer 30a is secured to shield the light incident onto the semiconductor layer 30a from an upper or diagonal direction (a direction crossing the Z-direction). The light shielding film 8 has conductivity, is provided in the fourth layer between the gate electrode 30g and the scan line 3a or gate wiring, and is electrically coupled to the capacitance line 7b or constant potential (common potential) wiring. Therefore, it is possible to reduce the influence of the gate potential provided in the scan line 3a, upon the semiconductor layer 30a.

Further, since the common potential is applied to the light shielding film 8, and thus, the light shielding film 8 can be provided close to the semiconductor layer 30a. Therefore, the light shielding property of the light shielding film 8 to the TFT 30 is further improved, and the stray light incident onto the semiconductor layer 30a is reduced. Thus, compared to the related art, the light shielding property to the TFT 30 is improved, and the liquid crystal apparatus 100 as an electro-optical device with a reduced off-leak current in the TFT 30 can be provided.

Since the light shielding film 8 overlaps with the boundary between the low-concentration drain region 30e and the gate electrode 30g in a plan view, the light shielding structure where an off-leak current in the TFT 30 hardly occurs can be formed.

Because of the contact hole 43 as a gate contact, the scan line 3a is arranged away from the semiconductor layer 30a. Therefore, the influence of the gate potential upon the semiconductor layer 30a other than the channel region 30c can be further reduced. In a plan view, the opening portion 8a is surrounded by the light shielding film 8, and thus, the light shielding property against the stray light incident onto the semiconductor layer 30a can be further improved.

Embodiment 2

Light Shielding Structure of Element Substrate

The light shielding structure of the element substrate in the liquid crystal apparatus as an electro-optical device according to the present embodiment will be described. The liquid crystal apparatus of the present embodiment includes a different light shielding structure from that of the element substrate 10 in the liquid crystal apparatus 100 of Embodiment 1, and is provided with a display region E (the non-opening region and the opening region) similar to that of the liquid crystal apparatus 100. Therefore, in the description of the liquid crystal apparatus according to the present embodiment, cross-sectional views along the line segments A-A', B-B', and C-C' illustrated in FIG. 4 will be also used.

Figure 15:
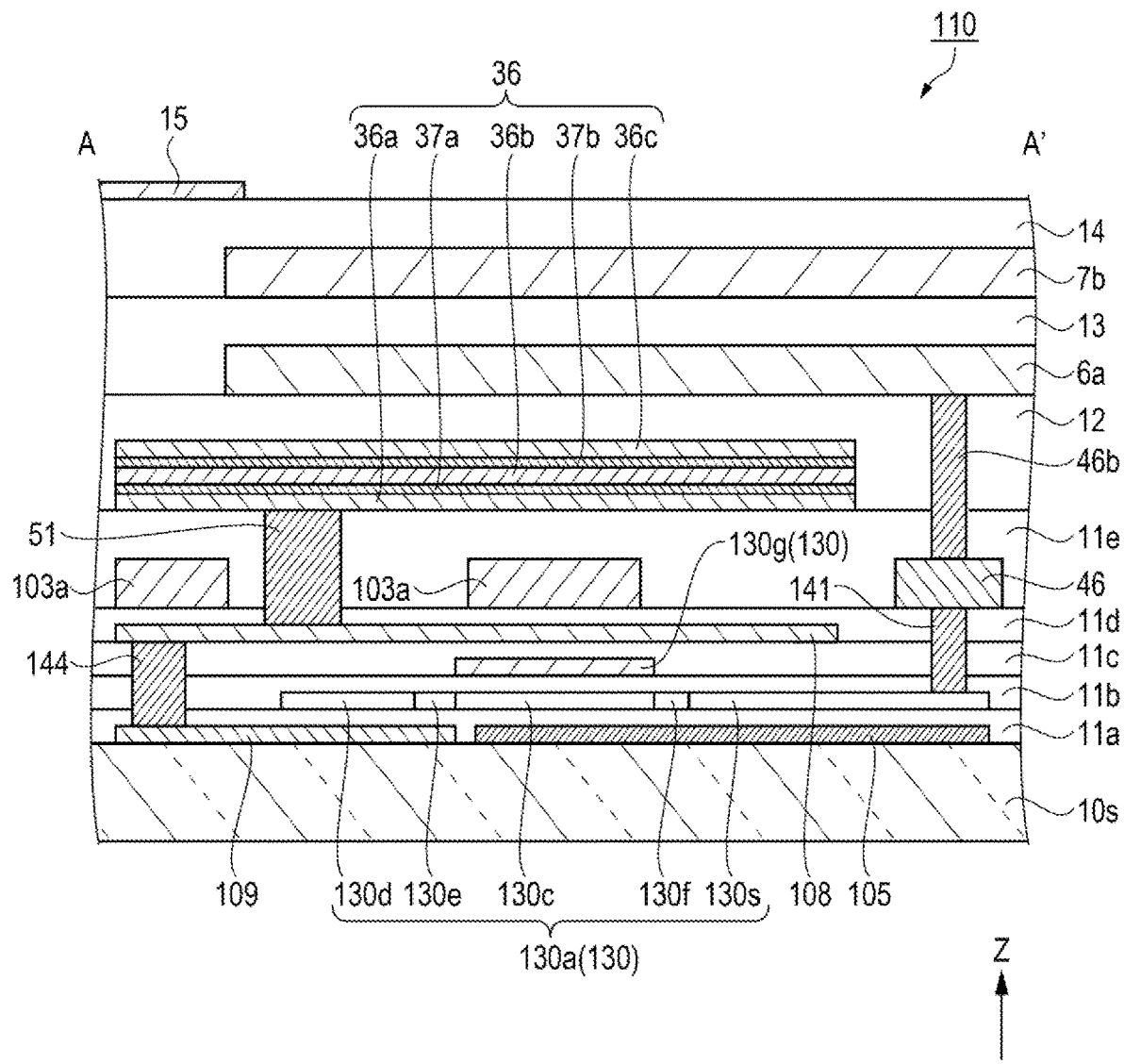
FIG. 15 is a cross-sectional view schematically illustrating a structure of an element substrate taken along line A-A' of FIG. 4, according to Embodiment 2.
Figure 16:
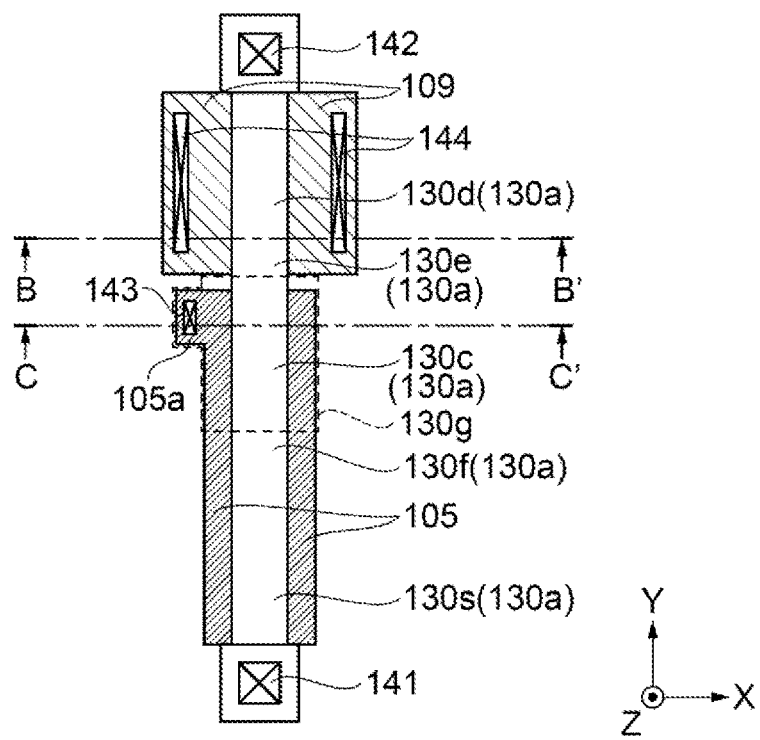
FIG. 16 is a plan view schematically illustrating disposition of main parts in each layer of the element substrate.
Figure 17:
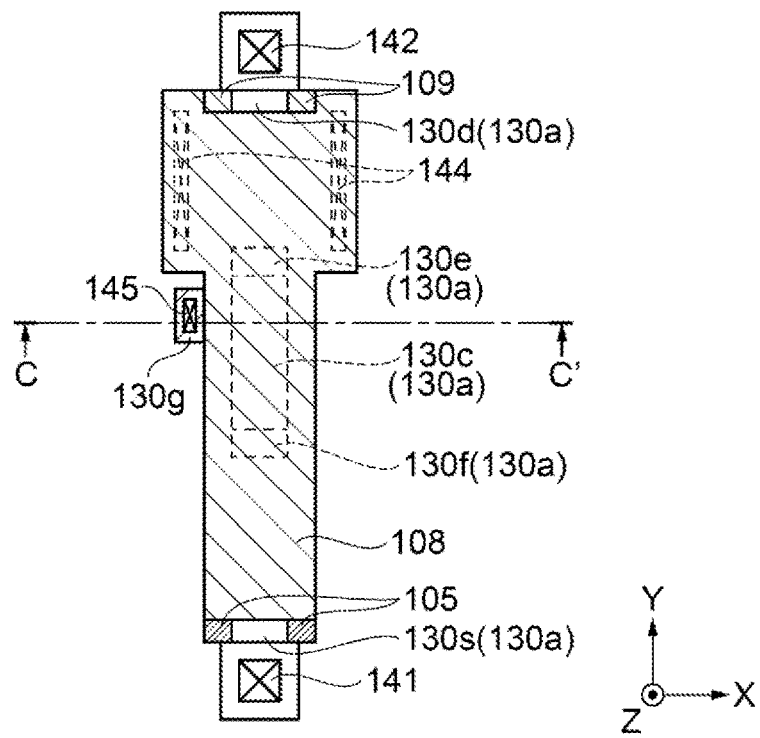
FIG. 17 is a plan view schematically illustrating disposition of main parts in each layer of the element substrate.
Figure 18:
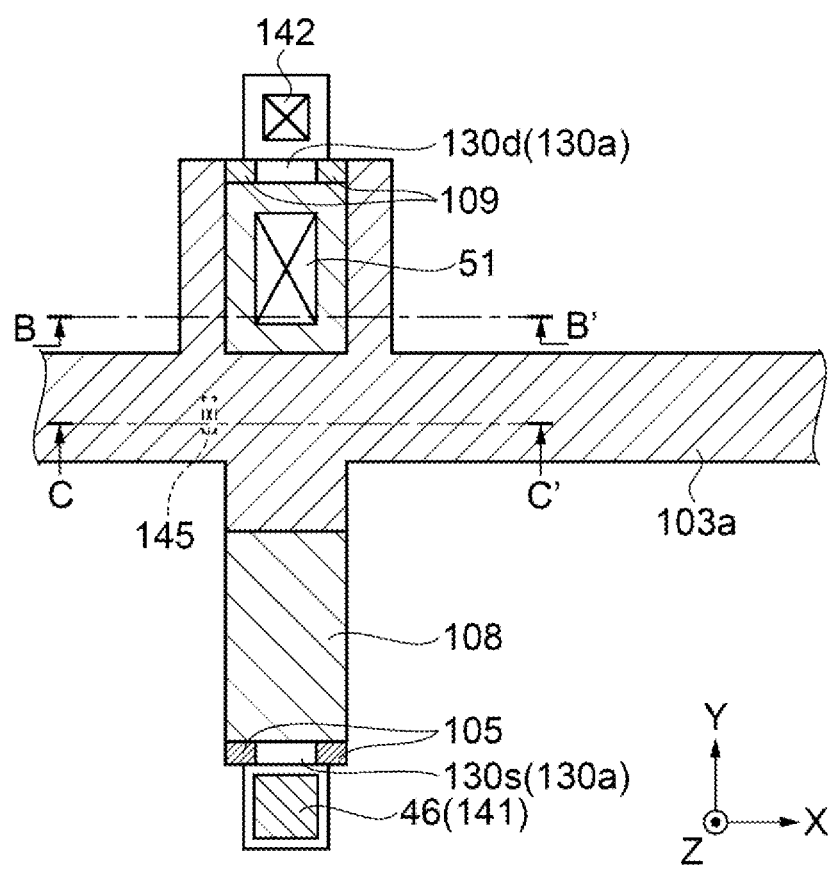
FIG. 18 is a plan view schematically illustrating disposition of main parts in each layer of the element substrate.
Figure 19:
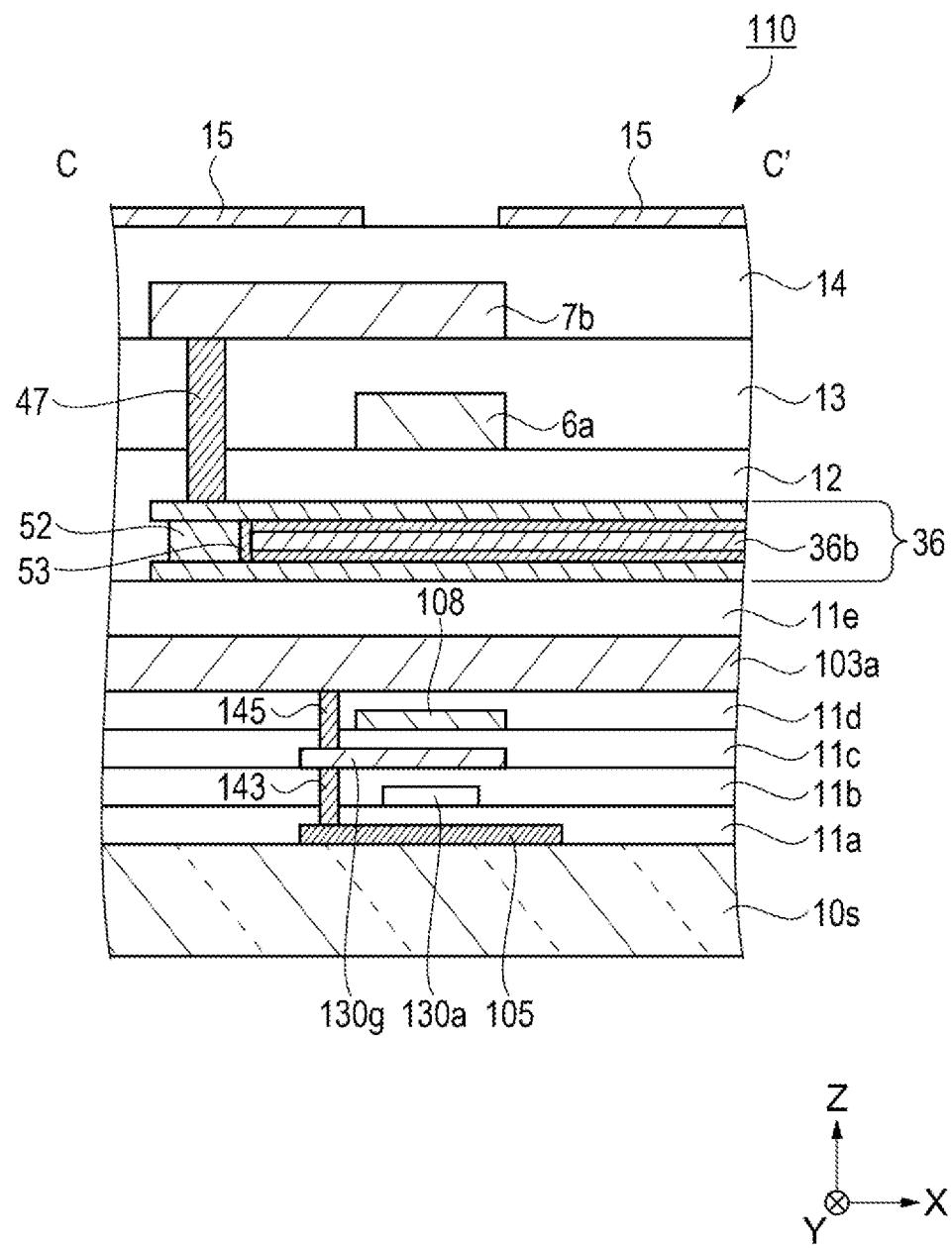
FIG. 19 is a cross-sectional view schematically illustrating a structure of the element substrate taken along line C-C' of FIG. 4.
Figure 20:
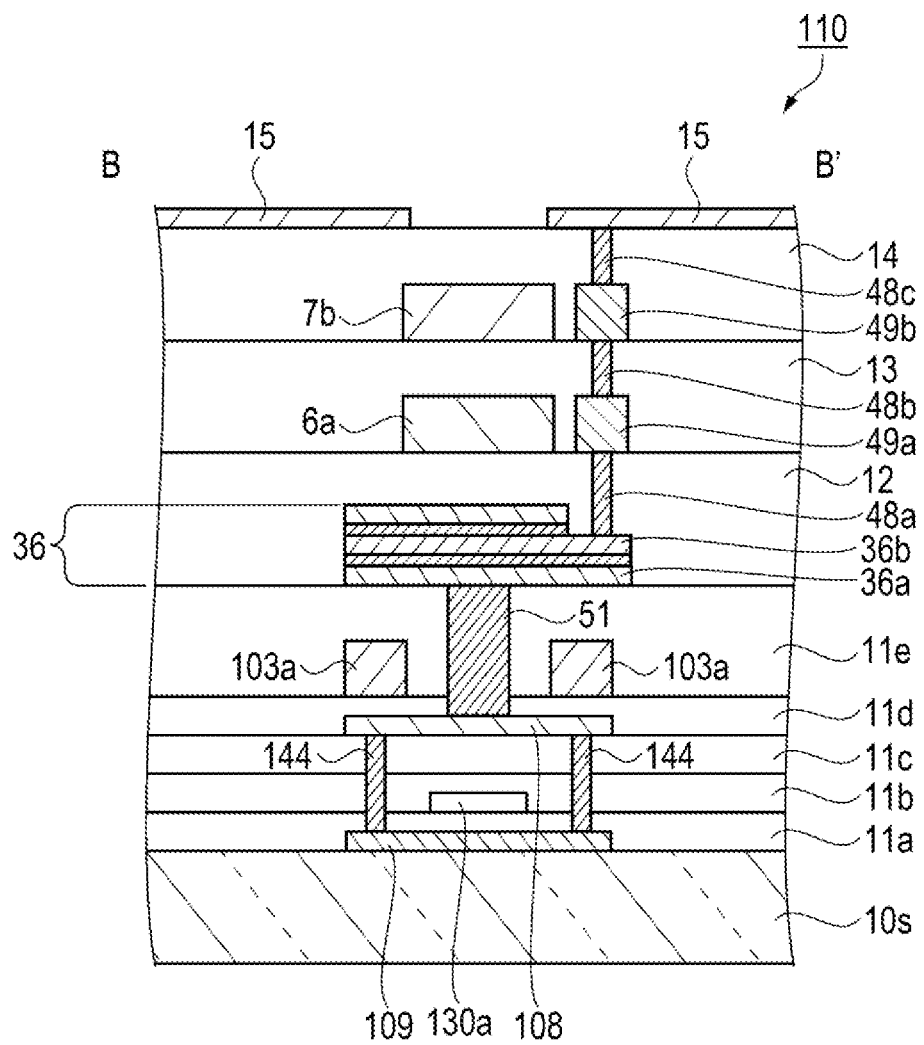
FIG. 20 is a cross-sectional view schematically illustrating a structure of the element substrate taken along line B-B' of FIG. 4.

The description will be provided below with reference to FIG. 15 to FIG. 20. FIG. 15 is a cross-sectional view schematically illustrating the structure of the element substrate taken along line A-A' in FIG. 4, according to Embodiment 2. FIG. 16 to FIG. 18 are plan views each schematically illustrating disposition of main parts in each layer of the element substrate. FIG. 19 is a cross-sectional view schematically illustrating the structure of the element substrate taken along line C-C' in FIG. 4. FIG. 20 is a cross-sectional view schematically illustrating the structure of the element substrate taken along line B-B' in FIG. 4.

Here, in FIG. 16 to FIG. 18, the non-opening region between the pixels P adjacent along the X-direction is enlarged and illustrated in a plan view, and illustration of the base insulating film 11a, the gate insulating film 11b, the first to sixth interlayer insulating films is omitted. In FIG. 15, FIG. 19, and FIG. 20, a cross-sectional positional relation of each of the components is expressed on a scale for clarity, and illustration of the alignment film 18 is omitted. Note that the configurations as in Embodiment 1 are referenced using like symbols, and no detailed descriptions for such configurations are provided below.

First, a schematic configuration of an element substrate 110 included in the liquid crystal apparatus according to the present embodiment will be described. As illustrated in FIG. 15, the element substrate 110 includes a TFT 130 as a transistor including a semiconductor layer 130a and a gate electrode 130g, a gate wiring, a light shielding film 108, and a wiring 109 as constant potential wiring in addition to the capacitance line 7b. The light shielding film 108 and the wiring 109 are electrically coupled to the capacitance line 7b of a constant potential (common potential). The first layer to the ninth layer being a plurality of layers are layered on the substrate 10s of the element substrate 110.

The gate wiring includes a conductive light-shielding layer 105 as a first gate wiring and a scan line 103a as a second gate wiring provided in a layer above the conductive light-shielding layer 105. The conductive light-shielding layer 105 and the scan line 103a are electrically coupled to the gate electrode 130g. The TFT 130 (third layer) and the light shielding film 108 (fourth layer) are provided between the conductive light-shielding layer 105 (first layer) and the scan line 103a (fifth layer).

The element substrate 110 has different structures of the first layer to the fourth layer from those in the element substrate 10 according to Embodiment 1, and the similar structures of the fifth layer to the ninth layer thereto.

The conductive light-shielding layer 105 and the wiring 109 are provided on the first layer on the substrate 10s of the element substrate 110. A forming material similar to that of the conductive light-shielding layer 5 according to Embodiment 1 can be employed for the conductive light-shielding layer 105. The conductive light-shielding layer 105 is electrically coupled to the scan line 103a. In the present embodiment, the conductive light-shielding layer 105 is patterned and formed by a photolithographic method using tungsten silicide.

The wiring 109 is one example of a light shielding structure including the light shielding film of the present disclosure, in addition to the light shielding film 108 described later. A feature that the wiring 109 is provided, a feature that the below-described light shielding film 108 does not include an opening portion and the like are different from those in Embodiment 1. In the present embodiment, the wiring 109 is provided below the layer where the TFT 130 is provided, and the capacitance line 7b is provided above the layer, as the constant potential wiring, respectively. The wiring 109 is electrically coupled to the light shielding film 108 through a contact hole 144. The common potential (constant potential) is applied to the light shielding film 108 through the contact hole 51, the capacitance lower electrode 36a and the like described below. That is, the wiring 109 is provided with the common potential, and is provided (on the first layer) below the layer where the TFT 130 as the transistor is provided.

The wiring 109 can employ a forming material similar to that of the conductive light-shielding layer 105, and is patterned and formed by a photolithographic method. In the present embodiment, tungsten silicide is used for the wiring 109. Thicknesses of the conductive light-shielding layer 105 and the wiring 109 are not particularly limited, but are, for example, about 150 nm.

The base insulating film 11a is provided between the conductive light-shielding layer 105 and the wiring 109, and the second layer. The base insulating film 11a has a similar configuration to that in Embodiment 1.

The TFT 130 is formed on the second layer and the third layer on the first layer. The TFT 130 includes the semiconductor layer 130a provided in the second layer and the gate electrode 130g provided in the third layer. A Lightly Doped Drain (LDD) structure is formed on the semiconductor layer 130a of TFT 130.

The semiconductor layer 130a is provided to extend in the Y-direction on the second layer. The semiconductor layer 130a has a similar configuration to that of the semiconductor layer 30a in Embodiment 1.

The gate insulating film 11b is provided to cover the semiconductor layer 130a. The gate insulating film 11b has a similar configuration to that in Embodiment 1.

The gate electrode 130g is provided in the third layer to face the channel region 130c in the Z-direction. A forming material similar to that of the gate electrode 30g according to Embodiment 1 can be employed for the gate electrode 130g. In the present embodiment, the gate electrode 130g includes a two-layered structure of a conductive polysilicon film and a tungsten silicide film. A film thickness of the gate electrode 130g is not particularly limited, but is, for example, about 150 nm.

Above the gate electrode 130g, the first interlayer insulating film 11c is provided to cover the gate electrode 130g. The first interlayer insulating film 11c has a similar configuration to that of Embodiment 1.

The contact hole 144 is provided on the first interlayer insulating film 11c. The contact hole 144 penetrates from the base insulating film 11a to the first interlayer insulating film 11c and is electrically coupled to the wiring 109. After a through-hole is formed by dry-etching the base insulating film 11a to the first interlayer insulating film 11c, the contact hole 144 is formed to fill the through-hole, together with the light shielding film 108 electrically coupled in an upper layer.

The light shielding film 108 is provided on the fourth layer on the third layer. The light shielding film 108 is formed to overlap with the semiconductor layer 130a in a plan view, that is, an approximately entire region of the semiconductor layer 130a including a high-concentration drain region 130d, a low-concentration drain region 130e, the channel region 130c, and a low-concentration source region 130f. Therefore, the light shielding property for shielding the light incident onto the semiconductor layer 130a from above is secured by the light shielding film 108. The light shielding film 108 does not include an opening portion like the opening portion 8a of the light shielding film 8 in Embodiment 1. A contact hole electrically coupling the gate electrode 130g and the scan line 103a will be described below.

The light shielding film 108 is electrically coupled to the capacitance lower electrode 36a of the storage capacitance 36 in the sixth layer through the contact hole 51. Therefore, the constant potential is applied to the light shielding film 108 through the capacitance lower electrode 36a. This can reduce an influence of the gate potential in the scan line 103a provided in the fifth layer. Further, as compared with a case where a wiring having a gate potential is used as a light shielding film, an off-leak current in the TFT 130 can be reduced even if the light shielding film 108 is disposed close to the semiconductor layer 130a.

A forming material similar to that of the light shielding film 8 according to Embodiment 1 can be employed for the light shielding film 108. In the present embodiment, titanium nitride (TiN) is also employed for the light shielding film 108. A film thickness of the light shielding film 108 is not particularly limited, but is, for example, about 100 nm.

The second interlayer insulating film 11d is provided to cover the light shielding film 108. The second interlayer insulating film 11d has a similar configuration to that of Embodiment 1.

A contact hole 141 is provided on the second interlayer insulating film 11d. The contact hole 141 penetrates from the gate insulating film 11b to the second interlayer insulating film 11d and is electrically coupled to a high-concentration source region 130s of the semiconductor layer 130a. Although not illustrated in FIG. 15, a contact hole 142 (see FIG. 16) to be electrically coupled to the capacitance intermediate electrode 36b of the storage capacitance 36 is provided in the high-concentration drain region 130d of the semiconductor layer 130a. After a through-hole is formed by dry-etching from the gate insulating film 11b to the second interlayer insulating film 11d, the contact hole 142 is formed to fill the through-hole, together with the relay layer 46 electrically coupled in an upper layer.

The above description is for the configurations of the first layer to the fourth layer in the element substrate 110. The configurations of the fifth layer to the ninth layer of the element substrate 110 are similar to those of the element substrate 10 according to Embodiment 1.

Next, the light shielding structure of the element substrate 110 will be described. FIG. 16 illustrates a state where the conductive light-shielding layer 105 (first layer) and the semiconductor layer 130a (second layer) are viewed from above. The gate electrode 130g (third layer) facing the channel region 130c of the semiconductor layer 130a in the Z-direction is illustrated with a broken line.

As illustrated in FIG. 16, below the semiconductor layer 130a disposed along the Y-direction, the wiring 109 and the conductive light-shielding layer 105 are overlapped and disposed. The wiring 109 on the high-concentration drain region 130d side and the conductive light-shielding layer 105 on the high-concentration source region 130s side are arranged along the Y-direction, relative to the elongated semiconductor layer 130a. The wiring 109 and the conductive light-shielding layer 105 are substantially rectangular, and widths of the wiring 109 and the conductive light-shielding layer 105 in the Y-direction are formed larger than the width of the semiconductor layer 130a.

The wiring 109 is coupled with the pair of contact holes 144 facing while the high-concentration drain region 130d and the low-concentration drain region 130e of the semiconductor layer 130a are interposed therebetween. The wiring 109, which is coupled with the pair of contact holes 144, has a width in the X-direction larger than the width of the conductive light-shielding layer 105.

The conductive light-shielding layer 105 overlaps with an approximately entire area of the channel region 130c, the low-concentration source region 130f, and the high-concentration source region 130s. The conductive light-shielding layer 105 is provided with a projection 105a projecting in the negative X-direction at an end in the positive Y-direction. The projection 105a is coupled with the contact hole 143 as a gate contact. The conductive light-shielding layer 105 is electrically coupled to the gate electrode 130g through the contact hole 143. For coupling with the contact hole 143, the gate electrode 130g has a shape in which a portion facing the projection 105a is projected.

The pair of contact holes 144 have an elongated rectangular cross-section in the XY plane. As illustrated in FIG. 20, the pair of contact holes 144 electrically couple the wiring 109 and the light shielding film 108 of the fourth layer. Further, the pair of contact holes 144 are provided on both sides interposing the low-concentration drain region 130e and the high-concentration drain region 130d, and extend upward in a wall shape. Therefore, the contact holes 144 can shield the light incident onto the high-concentration drain region 130d and the low-concentration drain region 130e mainly from a direction crossing the Z-direction.

Returning to FIG. 16, the contact holes 141 and 142 are coupled to the both ends in the Y-direction of the semiconductor layer 130a. Therefore, a width in the X-direction at the both ends in the Y-direction of the semiconductor layer 130a is formed to be wider than a width in the X-direction between the high-concentration drain region 130d and the high-concentration source region 130s. Here, although not illustrated in FIG. 16, the wiring 109 is provided at a lower part of the end of the high-concentration drain region 130d (semiconductor layer 130a) to which the contact holes 142 are coupled. In addition, the conductive light-shielding layer 105 is provided also at a lower part of the end of the high-concentration source region 130s (semiconductor layer 130a) to which the contact holes 141 are coupled. As a result, light incident mainly from below onto the semiconductor layer 130a can be shielded. The wiring 109 of the first layer and the pair of contact holes 144 may be omitted, and the conductive light-shielding layer 105 may be provided to be enlarged to a region where the wiring 109 is provided.

FIG. 17 illustrates a state where the conductive light-shielding layer 105 of the first layer and the wiring 109 to the light shielding film 108 (fourth layer) are viewed from above. That is, in FIG. 17, the gate electrode 130g, a contact hole 145, and the light shielding film 108 are added to the configuration of FIG. 16. In addition, in FIG. 17, below the light shielding film 108, the low-concentration drain region 130e is indicated with a dotted line, the channel region 130c is indicated with a broken line with one dot, the low-concentration source region 130f is indicated with a broken line with two dots, and the contact hole 144 is indicated with a broken line, respectively transparently.

As illustrated in FIG. 17, the light shielding film 108 has a shape elongated in the Y-direction. The light shielding film 108 is provided to overlap with an approximately entire area of the semiconductor layer 130a including the low-concentration drain region 130e, the low-concentration source region 130f, and the channel region 130c, in a plan view. The pair of contact holes 144 are electrically coupled below the light shielding film 108. In the light shielding film 108, a width in the X-direction of a region coupled to the pair of contact holes 144 is larger than a width of the other regions.

Since the light shielding film 108 does not include an opening portion, as described above, and overlaps with an approximately entire area of the semiconductor layer 130a, light incident from above the element substrate 110 onto the semiconductor layer 130a can be efficiently reduced.

The gate electrode 130g is coupled with a contact hole 145 or gate contact at a position to face the projection 105a in the Z-direction (vertical direction). Therefore, a region where the projection 105a of the conductive light-shielding layer 105 and the contact hole 145 of the gate electrode 130g are coupled does not overlap with the light shielding film 108 in a plan view. In the gate electrode 130g, at a lower layer side where the contact hole 145 is coupled, the contact hole 143 (see FIG. 16) is coupled. Thus, as illustrated in FIG. 19, the conductive light-shielding layer 105 and the gate electrode 130g are electrically coupled through the contact hole 143, and the scan line 103a and the gate electrode 130g are electrically coupled through the contact hole 145, respectively.

FIG. 18 illustrates a state where the conductive light-shielding layer 105 of the first layer and the wiring 109 to the scan line 103a (fifth layer) are viewed from above. That is, in FIG. 18, the scan line 103a, the relay layer 46, and the contact hole 51 are added to the configuration of FIG. 17. In FIG. 18, the contact hole 145 below the scan line 103a is indicated transparently with a broken line.

As illustrated in FIG. 18, the contact hole 51 is coupled to a side of the high-concentration drain region 130d of the light shielding film 108. The scan line 103a, which extends along the X-direction, is provided so that a part of the scan line 103a is protruded in the negative Y-direction to overlap with the channel region 130c (see FIG. 17). Note that as described above, the contact hole 141 is electrically coupled to the relay layer 46. Further, as illustrated in FIG. 20, the light shielding film 108 and the capacitance lower electrode 36a of the sixth layer are electrically coupled through the contact hole 51. Thus, the structures of the fifth layer to the ninth layer are similar to those of Embodiment 1.

As described above, based on the liquid crystal apparatus according to the present embodiment, in addition to the effects provided in Embodiment 1, the following effects can be obtained.

Since the light shielding film 108 does not include an opening portion and overlaps with up to the channel region 130c in a plan view, the stray light incident onto the semiconductor layer 130a is reduced and the light shielding property can be improved. Further, the conductive light-shielding layer 105 and the scan line 103a can shield the light below and above the semiconductor layer 130a, and the light shielding property for the semiconductor layer 130a can be further improved.

With the pair of contact holes 144 between the light shielding film 108 and the wiring 109, a lateral side of the semiconductor layer 130a can be light-shielded. Further, the wiring 109 can shield light onto the lower part of the semiconductor layer 130a, and the light shielding property for the semiconductor layer 130a can be further improved. Further, the pair of contact holes 144 are provided at both sides interposing the low-concentration drain region 130e, and thus, the light shielding property for the low-concentration drain region 130e can be further improved.

The wiring 109 to which the constant potential is applied is provided below the high-concentration drain region 130d and the low-concentration drain region 130e of the semiconductor layer 130a. Therefore, because of the wiring 109, the resistance of the low-concentration drain region 130e is not easily lowered, and the wiring 109 can be provided closer to the semiconductor layer 130a than the related art. Thus, the light shielding property is further improved against the light incident from the base material 10s side (below) to the high-concentration drain region 130d and the low-concentration drain region 130e. That is, occurrence of an off-leak current of the TFT 130 due to the light incident onto the semiconductor layer 130a from below can be more surely prevented.

Based on the liquid crystal apparatus according to the present embodiment, an effect similar to that of Embodiment 2 can be achieved. Further, since the wiring 109 is omitted, the structure of the first layer can be simplified.

Embodiment 3

Electronic Apparatus

Figure 21:
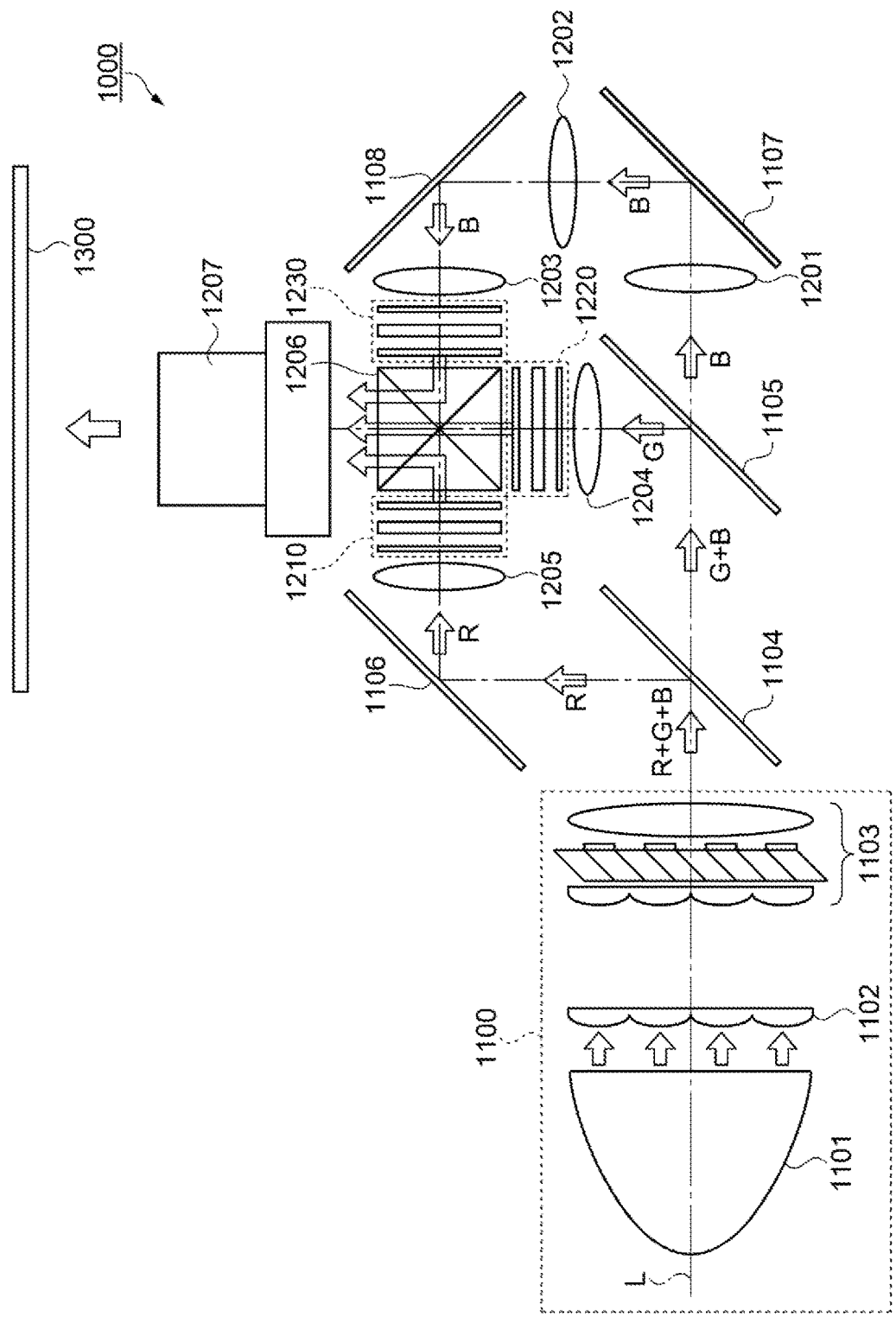
FIG. 21 is a schematic view illustrating a configuration of a projection-type display apparatus as an electronic apparatus according to Embodiment 4.

As a projection-type display apparatus as an electronic apparatus according to the present embodiment will be described with reference to FIG. 21. FIG. 21 is a schematic view illustrating a configuration of the projection-type display apparatus as an electronic apparatus according to Embodiment 3.

On a projection-type display apparatus 1000 according to the present embodiment, the liquid crystal apparatus as an electro-optical device according to Embodiment 3 is mounted.

As illustrated in FIG. 21, the projection-type display apparatus 1000 according to the present embodiment includes a polarized light illumination apparatus 1100 disposed along a system optical axis L, two dichroic mirrors 1104 and 1105 as light separation elements, three reflection mirrors 1106, 1107, and 1108, five relay lenses 1201, 1202, 1203, 1204, and 1205, three transmissive liquid crystal light valves 1210, 1220, and 1230 as optical modulation means, a cross dichroic prism 1206 as a photosynthetic element, and a projection lens 1207.

The polarized light illumination apparatus 1100 is generally configured of a lamp unit 1101 as a light source including a white light source such as an extra-high pressure mercury lamp or a halogen lamp, an integrator lens 1102, and a polarization conversion element 1103.

The dichroic mirror 1104 reflects red light (R) of a polarized light flux emitted from the polarized light illumination apparatus 1100 and transmits green light (G) and blue light (B). The other dichroic mirror 1105 reflects the green light (G) transmitted by the dichroic mirror 1104 and transmits the blue light (B).

The red light (R) reflected by the dichroic mirror 1104 is reflected by the reflection mirror 1106 and subsequently is incident on the liquid crystal light valve 1210 via the relay lens 1205. The green light (G) reflected by the dichroic mirror 1105 is incident on the liquid crystal light valve 1220 via the relay lens 1204. The blue light (B) transmitted by the dichroic mirror 1105 is incident on the liquid crystal light valve 1230 via a light guide system including three relay lenses 1201, 1202, and 1203 and two reflection mirrors 1107 and 1108.

The liquid crystal light valves 1210, 1220, and 1230 are each disposed to face an incident surface of each type of color light of the cross dichroic prism 1206. The color light incident on the liquid crystal light valves 1210, 1220, and 1230 is modulated based on video information (video signal) and is emitted toward the cross dichroic prism 1206.

In this prism, four rectangular prisms are bonded together, and on inner surfaces of the prisms, a dielectric multilayer film configured to reflect red light and a dielectric multilayer film configured to reflect blue light are formed in a cross shape. Three types of color light are synthesized by these dielectric multilayer films, and light representing a color image is synthesized. The synthesized light is projected onto a screen 1300 by the projection lens 1207 as a projection optical system, and an image is enlarged and displayed.

The liquid crystal light valve 1210 is a valve to which the aforementioned liquid crystal apparatus 100 (see FIG. 1) is applied. In the liquid crystal apparatus 100, a pair of light-polarizing elements disposed in a crossed-Nicols state on the incident side and the emission side of the color light are disposed with a gap interposed between the pair of light-polarizing elements. The same applies to the other liquid crystal light valves 1220 and 1230.

According to such a projection-type display apparatus 1000, the liquid crystal apparatus 100 of Embodiment 1 is used, and thus, in the liquid crystal apparatus 100, the light shielding property for the semiconductor layer is improved, and an off-leak current of the transistor is reduced. Thus, it is possible to provide the projection-type display apparatus 1000 in which display quality such as pixel unevenness is improved. In addition, as the liquid crystal light valves 1210, 1220, and 1230, the liquid crystal apparatus according to Embodiment 2 can also be employed in place of the liquid crystal apparatus 100 to obtain a similar effect.

In addition, the light source used for the polarized light illumination apparatus 1100 is not limited to a white light source such as an extra-high pressure mercury lamp and a halogen lamp, and a LED light source or a laser light source that emits monochromatic light corresponding to blue light, green light, and red light may be disposed to correspond to each of the liquid crystal light valves 1210, 1220, and 1230 onto which the color light is incident.

In addition to the projection-type display apparatus 1000, the liquid crystal apparatus 100 may be mounted on various types of electronic apparatuses such as an Electrical View Finder (EVF), a mobile mini-projector, a head-up display, a smartphone, a mobile telephone, a mobile computer, a digital camera, a digital video camera, a display, an on-vehicle device, an audio device, and an exposure device, and an illumination device.

Modification 1

In an element substrate in a liquid crystal apparatus as an electro-optical device according to the present modification, a pixel electrode and a common electrode corresponding to the pixel electrode are provided, and a potential different from a potential applied to the common electrode is applied to a constant potential wiring. That is, the constant potential wiring in the element substrate according to Modification 1 is not electrically coupled to the common electrode, and receives a constant potential other than the common potential.

More specifically, in the element substrate 110 of Embodiment 2, the common potential is applied, through the light shielding film 108 and the like, to the wiring 109 as the constant potential wiring. On the other hand, in the modification, the constant potential wiring provided below the TFT is not electrically coupled to the light shielding film to which the common potential is applied, and is electrically coupled to a ground wiring. This feature is different from Embodiment 2. Further, the light shielding film may be also electrically coupled to the ground wiring.

According to the modification, in addition to the effect in Embodiment 2, an influence of the potential to the semiconductor layer (TFT) can be further reduced.

Modification 2

A structure of the element substrate 10 in Embodiment 1 is not limited to the above. For example, in Embodiment 1, the semiconductor layer 30a of the TFT 30 is arranged in an extending direction (Y-direction) of the data line 6a, but may also be arranged in an extending direction (X-direction) of the scan line 3a.

Modification 3

The electro-optical device is not limited to the liquid crystal apparatus according to the aforementioned embodiments. The electro-optical device may also be applied to an active drive type electro-optical device where a light emitting element such as an organic electroluminescence (EL) element is used in the pixel P.

Modification 4

The liquid crystal apparatus used as the electro-optical device used for the electronic apparatus (projection-type display apparatus) of the present disclosure is not limited to a transmissive type liquid crystal apparatus, and a reflection type liquid crystal apparatus may also be employed. That is, a projection-type display apparatus using a reflection type liquid crystal apparatus may be employed.

Contents derived from the embodiments are described below.

The electro-optical device has a plurality of layers layered on a substrate, and has a transistor including a semiconductor layer and a gate electrode, a gate wiring electrically coupled to the gate electrode and provided in a layer different from a layer where the gate electrode is provided, and a conductive light shielding film electrically coupled to the constant potential wiring. The light shielding film is provided in a layer between the gate electrode and the gate wiring, and overlaps with at least a part of the low-concentration drain region of the semiconductor layer, in a plan view from a layering direction of the plurality of layers.

With this configuration, the light shielding structure with a reduced off-leak current in the transistor can be formed. More specifically, since the light shielding film overlaps with at least a part of the low-concentration drain region, the light shielding property for the semiconductor layer is secured. The light shielding film has conductivity, is provided in a layer between the gate electrode and the gate wiring, and is electrically coupled to the constant potential wiring. Therefore, the influence of the gate potential of the gate wiring and the potential of the other signal wiring to the semiconductor layer can be reduced.

Further, since the constant potential is applied to the light shielding film, the light shielding film can be provided close to the semiconductor layer, and the light shielding property of the light shielding film is further improved to reduce the stray light incident on the semiconductor layer. Thus, as compared to the related art, the electro-optical device with an improved light shielding property for the semiconductor layer of the transistor and a reduced off-leak current in the transistor can be provided.

In the electro-optical device, it is preferable that the light shielding film overlaps with at least a part of a boundary between the low-concentration drain region and the gate electrode in the plan view.

With this configuration, the light shielding film overlaps up to the boundary with the gate electrode of the low-concentration drain region, and thus, it is possible to form the light shielding structure not easily allowing an off-leak current to be generated in the transistor.

It is preferable that in the electro-optical device, in the plan view, the light shielding film includes an opening portion at a position overlapping with the gate electrode, the opening portion overlaps with a channel region of the semiconductor layer, and the opening portion is provided with a contact hole electrically coupling the gate electrode and the gate wiring.

With this configuration, by the gate contact, the gate wiring is provided away from the semiconductor layer. Therefore, the influence of the gate potential upon the semiconductor layer other than the channel region can be further reduced.

It is preferable that in the electro-optical device, the opening portion is surrounded by the light shielding film in the plan view.

With this configuration, it is possible to further improve the light shielding property against the stray light incident on the semiconductor layer.

It is preferable that in the electro-optical device, in the plan view, the light shielding film overlaps with the channel region of the semiconductor layer, the gate wiring includes a first gate wiring and a second gate wiring provided in a layer above the first gate wiring, the first gate wiring and the second gate wiring are electrically coupled to the gate electrode through the gate contact provided in a projection of the first gate wiring, the projection does not overlap with the light shielding film in the plan view, and the transistor and the light shielding film are provided in a layer between the first gate wiring and the second gate wiring.

With this configuration, the light shielding film overlaps up to the channel region, and thus, the stray light incident on the semiconductor layer is reduced and the light shielding property can be further improved. In addition, it is possible to shield light above and below the semiconductor layer by the first gate wiring or the second gate wiring, and thus, the light shielding property for the semiconductor layer can be further improved.

It is preferable that in the electro-optical device, the constant potential wiring is provided in a layer below and a layer above a layer where the transistor is provided, and the light shielding film and the constant potential wiring are electrically coupled through a contact hole.

With this configuration, by the contact hole between the light shielding film and the constant potential wiring, the light on the lateral side of the semiconductor layer can be shielded. In addition, by the constant potential wiring, light below and above the semiconductor layer can be shielded, and thus, the light shielding property for the semiconductor layer is further improved.

It is preferable that in the electro-optical device, in the plan view, the contact hole is provided on both sides interposing the low-concentration drain region.

With this configuration, the light shielding property for the low-concentration drain region is further improved.

It is preferable that in the electro-optical device, a pixel electrode and a common electrode corresponding to the pixel electrode are provided, and a potential different from a potential applied to the common electrode is applied to the constant potential wiring.

With this configuration, the influence of the potential upon the semiconductor layer can be further reduced.

It is preferable that in the electro-optical device, a potential different from a potential of any of the gate electrode, and the source region and the drain region of the semiconductor layer is applied to the light shielding film.

With this configuration, the influence of the potential upon the semiconductor layer can be further reduced.

The electronic apparatus includes the electro-optical device.

With this configuration, the light shielding property for the semiconductor layer is improved, the electro-optical device having a reduced off-leak current in the transistor is provided, and an electronic apparatus in which display quality such as pixel unevenness is improved can be provided.

What is claimed is:

1. An electro-optical device, comprising:
   a transistor including a semiconductor layer and a gate electrode;
   a gate wiring electrically connected to the gate electrode and provided in a layer different from a layer where the gate electrode is provided, the gate wiring being supplied with scan signals;
   a constant potential wiring;
   a first interlayer insulating film and a second interlayer insulating film provided between the gate electrode and the gate wiring; and
   a conductive light shielding film electrically connected to the constant potential wiring, a constant potential being applied to the conductive light shielding film, wherein
   the light shielding film is provided in a layer between the gate electrode and the gate wiring, and in a plan view, overlaps with at least a part of a low-concentration drain region of the semiconductor layer, and includes an opening portion at a position overlapping with the gate electrode,
   the opening portion overlaps with a channel region of the semiconductor layer, and
   the opening portion is provided with a contact hole that penetrates the first interlayer insulating film and the second interlayer insulating film and is formed to fill with a conductive film, the contact hole being electrically coupled to the gate electrode, and the contact hole electrically connecting the gate electrode and the gate wiring.

2. The electro-optical device according to claim 1, wherein
   in the plan view, the light shielding film overlaps with at least a part of a boundary between the low-concentration drain region and the gate electrode.

3. The electro-optical device according to claim 1, wherein
   in the plan view, the opening portion is surrounded by the light shielding film.

4. The electro-optical device according to claim 1, wherein
   the light shielding film overlaps with the channel region of the semiconductor layer in the plan view,
   the gate wiring includes a first gate wiring and a second gate wiring provided in a layer above the first gate wiring,
   the first gate wiring and the second gate wiring are electrically connected to the gate electrode through a contact hole provided in a projection of the first gate wiring,
   the projection does not overlap with the light shielding film in the plan view, and
   the transistor and the light shielding film are provided in a layer between the first gate wiring and the second gate wiring.

5. The electro-optical device according to claim 1, wherein
   the constant potential wiring is provided in a layer below and a layer above a layer where the transistor is provided, and the light shielding film and the constant potential wiring are electrically connected through a contact hole.

6. The electro-optical device according to claim 5, wherein in the plan view, the contact hole is provided on both sides interposing the low-concentration drain region.

7. The electro-optical device according to claim 5, wherein a pixel electrode and a common electrode corresponding to the pixel electrode are provided, and a potential different from a potential applied to the common electrode is applied to the constant potential wiring.

8. The electro-optical device according to claim 1, wherein a potential, different from a potential of any of the gate electrode and the source region and the drain region of the semiconductor layer, is applied to the light shielding film.

9. An electronic apparatus comprising the electro-optical device according to claim 1.

\* \* \* \* \*